United States Patent
Yamada et al.

(10) Patent No.: US 10,707,338 B2
(45) Date of Patent: Jul. 7, 2020

(54) SEMICONDUCTOR DEVICE AND METHOD OF MANUFACTURING THE SAME

(71) Applicant: FUJITSU LIMITED, Kawasaki-shi, Kanagawa (JP)

(72) Inventors: Atsushi Yamada, Hiratsuka (JP); Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/284,162

(22) Filed: Feb. 25, 2019

(65) Prior Publication Data

US 2019/0296137 A1 Sep. 26, 2019

(30) Foreign Application Priority Data

Mar. 20, 2018 (JP) .................. 2018-053234

(51) Int. Cl.
*H01L 29/15* (2006.01)
*H01L 31/0256* (2006.01)
*H01L 29/778* (2006.01)
*H01L 29/66* (2006.01)
*H01L 29/04* (2006.01)

(52) U.S. Cl.
CPC ........ *H01L 29/7783* (2013.01); *H01L 29/045* (2013.01); *H01L 29/66462* (2013.01)

(58) Field of Classification Search
USPC .... 257/76, 20, 194, 615; 438/172, 478, 198, 438/270, 666, 704
See application file for complete search history.

(56) References Cited

U.S. PATENT DOCUMENTS

| | | | |
|---|---|---|---|
| 7,544,963 B2 | 6/2009 | Saxler | |
| 2009/0045438 A1* | 2/2009 | Inoue | H01L 29/155 257/192 |
| 2013/0264578 A1* | 10/2013 | Mishra | H01L 29/205 257/76 |
| 2016/0064539 A1* | 3/2016 | Lu | H01L 29/66462 257/76 |
| 2016/0260827 A1* | 9/2016 | Nishimori | H01L 29/1075 |
| 2019/0096879 A1* | 3/2019 | Chen | H01L 21/266 |

FOREIGN PATENT DOCUMENTS

| | | | |
|---|---|---|---|
| JP | 2009-231561 A | | 10/2009 |
| JP | 2012-109344 A | | 6/2012 |
| JP | 2012109344 | * | 6/2012 |

* cited by examiner

*Primary Examiner* — Niki H Nguyen
(74) *Attorney, Agent, or Firm* — Westerman, Hattori, Daniels & Adrian, LLP

(57) ABSTRACT

A semiconductor device includes a substrate; a first barrier layer containing AlN, over the substrate; a channel layer containing BGaN, over the first barrier layer; and a second barrier layer containing AlN, over the channel layer. A difference between a first lattice constant of the channel layer and a second lattice constant of the first barrier layer is less than or equal to 1.55% of the second lattice constant.

18 Claims, 21 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Priority Application No. 2018-053234 filed on Mar. 20, 2018, the entire contents of which are hereby incorporated by reference.

FIELD

The present disclosure relates to a semiconductor device and a method of manufacturing the same.

BACKGROUND

As semiconductor devices using nitride semiconductors, many reports on field effect transistors, especially, high-electron-mobility transistors (HEMT) have been made. As a HEMT using nitride semiconductors, a HEMT that uses a GaN layer for a channel layer and an AlGaN layer for a barrier layer has been known. In such a GaN-based HEMT, strain caused by a difference between the lattice constants of AlGaN and GaN occurs in the AlGaN layer; this strain brings a piezoelectric polarization; and a highly-concentrated two-dimensional electron gas is generated near the upper surface of the GaN layer under the AlGaN layer. For this reason, a high output can be obtained.

In order to improve the mobility, quantum-confinement-structure transistors that use a great band offset between AlN and GaN have also been proposed.

However, conventionally, it has been difficult to practically manufacture a quantum-confinement-structure transistor having a high quantum confinement effect.

RELATED-ART DOCUMENTS

Patent Documents

[Patent Document 1] U.S. Pat. No. 7,544,963

SUMMARY

In one aspect in the present disclosure, a semiconductor device includes a substrate; a first barrier layer containing AlN over the substrate; a channel layer containing BGaN over the first barrier layer; and a second barrier layer containing AlN over the channel layer. The difference between a first lattice constant of the channel layer and a second lattice constant of the first barrier layer is less than or equal to 1.55% of the second lattice constant.

The object and advantages in the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

Overview of Quantum-Confinement-Structure Transistor

Figure 1:
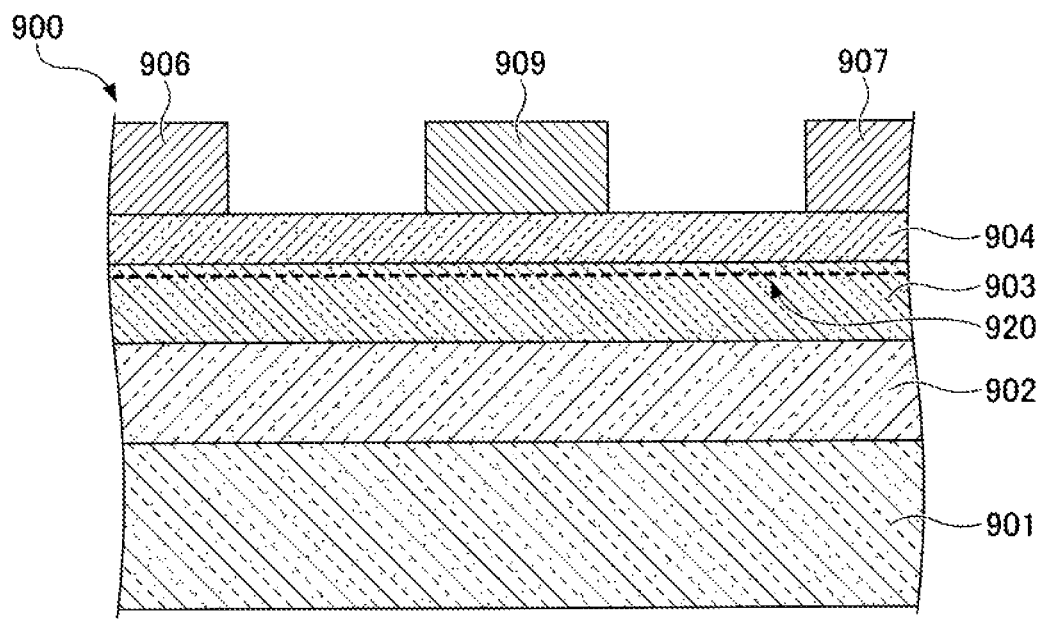
FIG. 1 is a cross-sectional view illustrating a configuration of a semiconductor device according to a comparative example.

First, an overview of a quantum-confinement-structure transistor will be described. FIG. 1 is a cross-sectional view illustrating a configuration of a semiconductor device according to a comparative example that includes a quantum-confinement-structure transistor.

In a semiconductor device 900 according to the comparative example, as illustrated in FIG. 1, an AlN buffer layer 902, a GaN electron transit layer 903, and an AlN carrier supply layer 904 are formed over an AlN substrate 901. Also, a source electrode 906, a gate electrode 909, and a drain electrode 907 are formed over the AlN carrier supply layer 904. In addition, a highly-concentrated two-dimensional electron gas (2DEG) 920 exists near the upper surface of the GaN electron transit layer 903.

In the semiconductor device 900, in theory, a great band offset between AlN and GaN brings an excellent quantum confinement effect. However, since there is a great difference of the lattice constants between GaN and AlN, a flat GaN electron transit layer 903 cannot be formed over the AlN buffer layer 902, and thereby, sufficient characteristics and reliability cannot be obtained. Although it is possible to make the difference of the lattice constants smaller by using AlGaN for the electron transit layer 903, this causes the band offset to become smaller, which results in a reduced quantum confinement effect.

Figure 2:
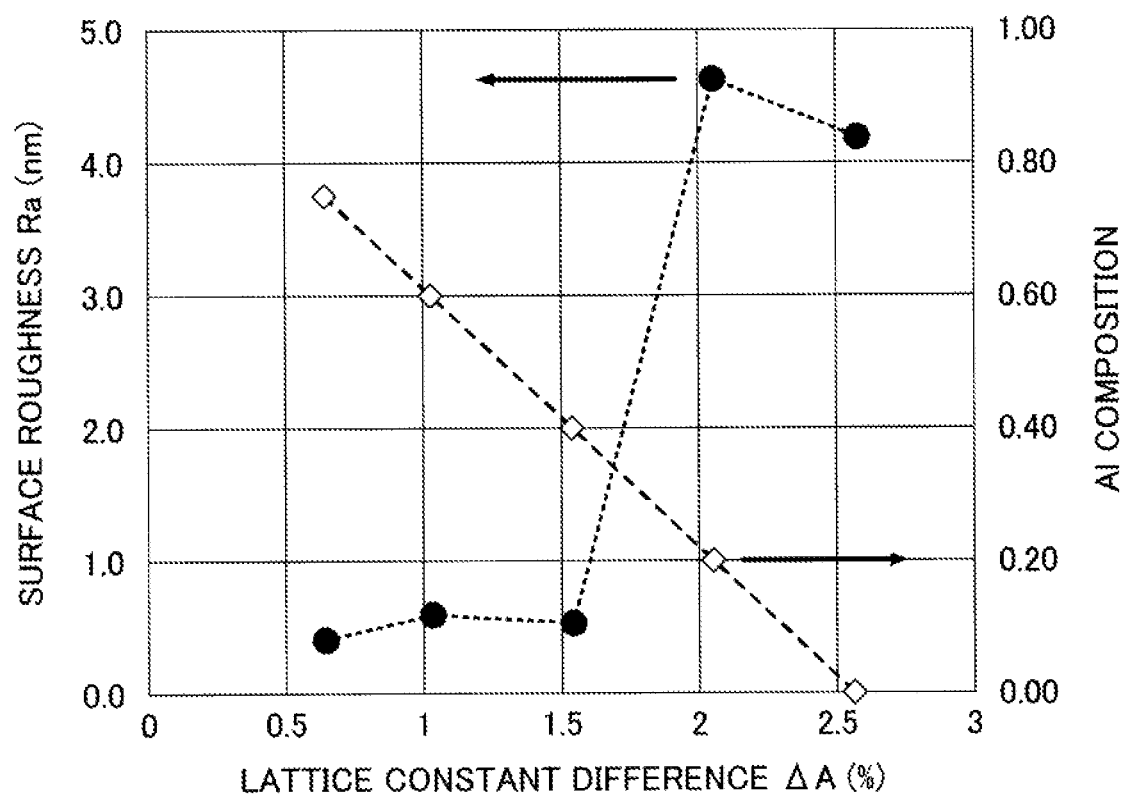
FIG. 2 is a diagram illustrating a relationship between a lattice constant difference ΔA and a surface roughness Ra.

FIG. 2 is a diagram illustrating a relationship between the lattice constant difference ΔA between AlN and AlGaN, and the surface roughness Ra. In FIG. 2, the surface roughness Ra (nm) is presented in the case of forming a 20-nm-thick AlGaN layer over a 300-nm-thick AlN layer. The lattice constant difference ΔA mentioned here is a ratio (percentage) of the difference between the lattice constant $A_{AlGaN}$ of AlGaN and the lattice constant $A_{AlN}$ of AlN, to the lattice constant $A_{AlN}$; namely, the following expression (1) holds. Also, the vertical axis on the right-hand side in FIG. 2 represents the Al composition of AlGaN corresponding to the lattice constant difference ΔA.

$$\Delta A = (A_{AlGaN} - A_{AlN})/A_{AlN} \times 100 \quad (1)$$

As illustrated in FIG. 2, in the case of the lattice constant difference ΔA being greater than 1.55%, the surface roughness of the AlGaN layer is great, whereas in the case of the lattice constant difference ΔA being less than or equal to 1.55%, the surface roughness of the AlGaN layer is extremely small. Meanwhile, in the case of the lattice constant difference ΔA being less than or equal to 1.55%, the Al composition of AlGaN is greater than or equal to 0.40, and the band offset between AlGaN and AlN is small.

Figure 3:
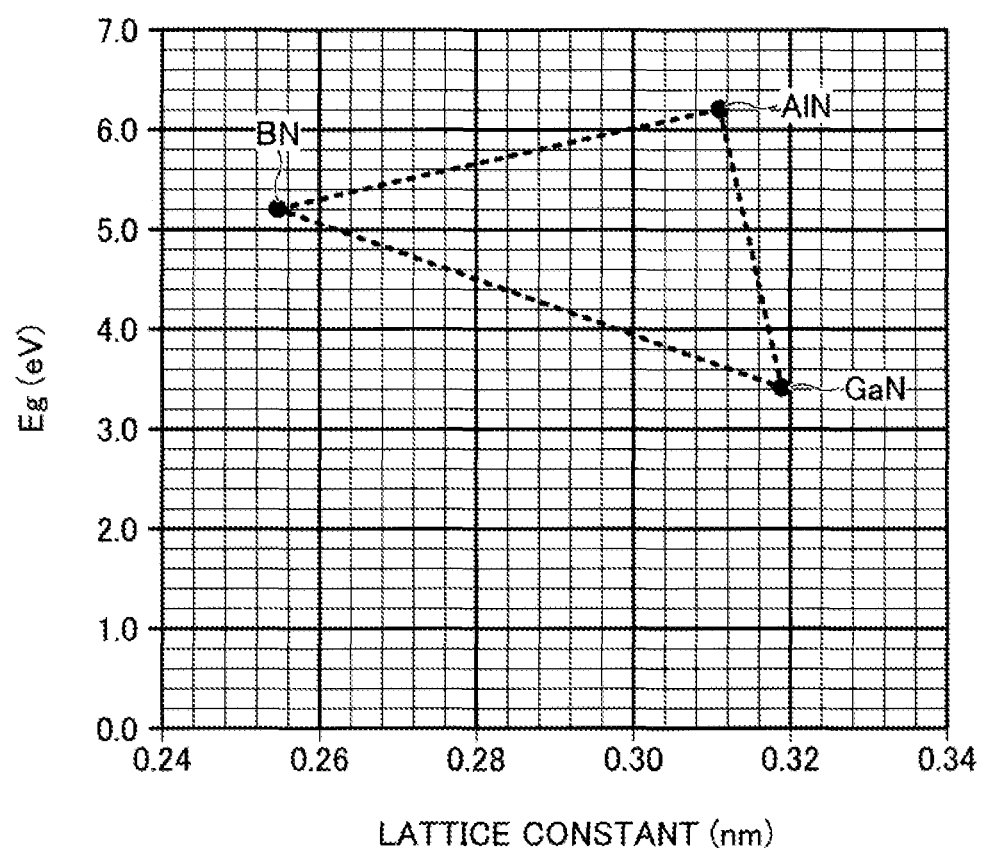
FIG. 3 is a diagram illustrating the lattice constants and the band gaps of GaN, AlN, and BN.
Figure 4:
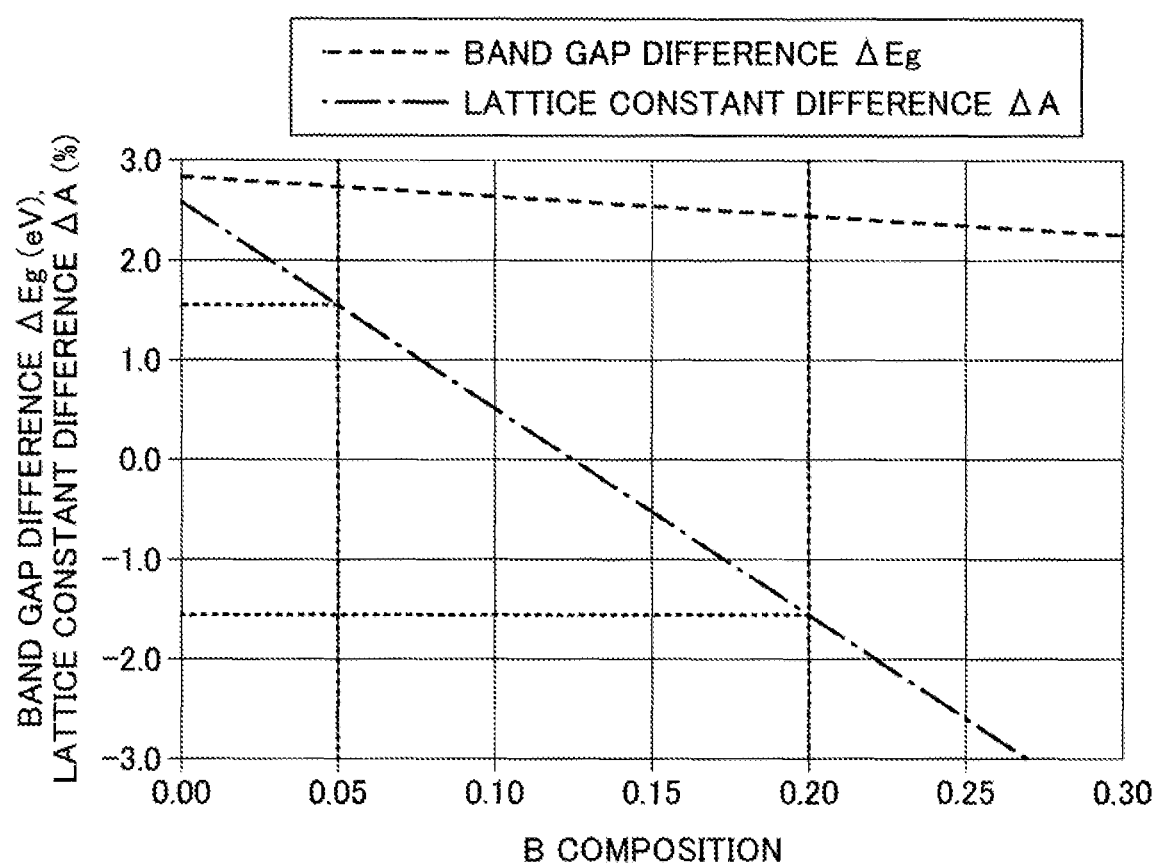
FIG. 4 is a diagram illustrating a relationship among the B composition, band gap difference, and lattice constant difference of BGaN.

Thereupon, the inventors have diligently examined materials suitable for the electron transit layer. Consequently, it has become clear that BGaN is suitable for the electron transit layer. FIG. 3 is a diagram illustrating the lattice constants and the band gaps of GaN, AlN, and BN. FIG. 4 is a diagram illustrating a relationship among the B composition, band gap difference, and lattice constant difference of BGaN.

As illustrated in FIG. 3, the lattice constant of BN (boron nitride) is extremely smaller than the lattice constant of GaN or AlN, and the band gap of BN is smaller than the band gap of AlN. For this reason, as illustrated in FIG. 4, in the case of using BGaN for the electron transit layer, a B composition of 0.05-0.20 enables to contain the lattice constant difference ΔA with AlN within ±1.55%, and to obtain a great band offset (band gap difference ΔEg) as high as 2.4 eV or greater. The lattice constant difference ΔA mentioned here is a ratio (percentage) of the difference between the lattice constant $A_{BGaN}$ of BGaN and the lattice constant $A_{AlN}$ of AlN, to the lattice constant $A_{AlN}$; namely, the following expression (2) holds.

$$\Delta A = (A_{BGaN} - A_{AlN})/A_{AlN} \times 100 \quad (2)$$

In this way, using BGaN for the electron transit layer enables to obtain a great band offset, while reducing the lattice constant difference ΔA and obtaining a satisfactory flatness. Therefore, it is possible to obtain a high quantum confinement effect while obtaining an excellent flatness. The inventors have come to conceive of the following embodiments based on these findings. In the following, the embodiments will be specifically described with reference to the attached drawings.

First Embodiment

Figure 5:
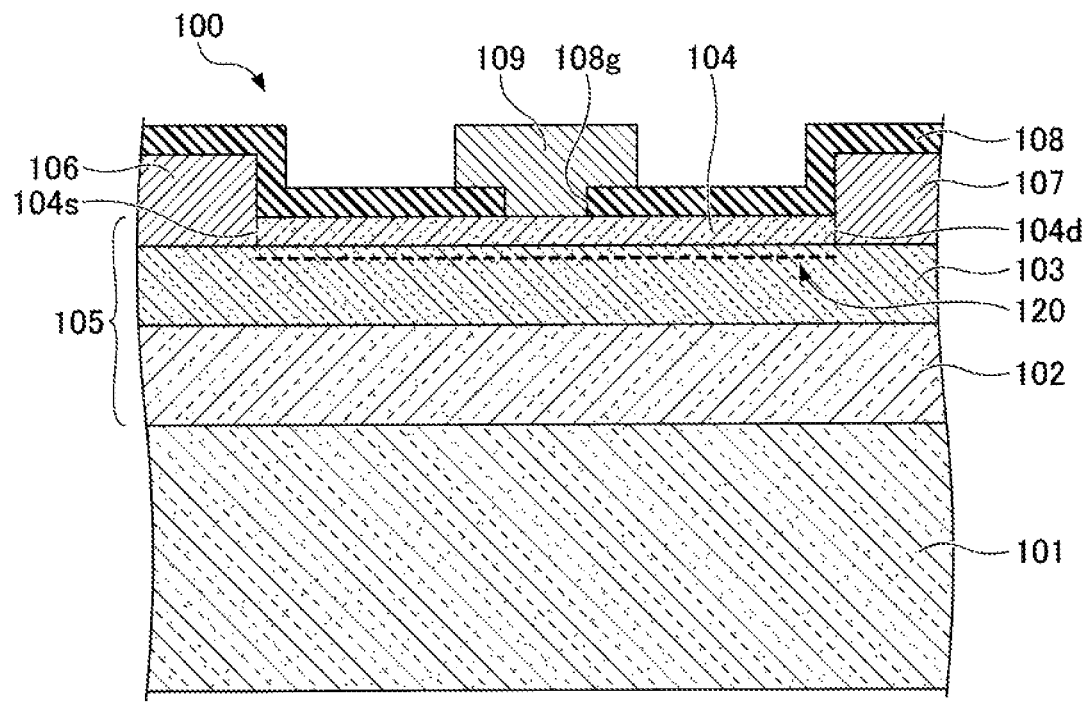
FIG. 5 is a cross-sectional view illustrating a configuration of a semiconductor device according to a first embodiment.

To begin with, a first embodiment will be described. The first embodiment relates to a semiconductor device that includes a high-electron-mobility transistor (HEMT) having a quantum confinement structure. FIG. 5 is a cross-sectional view illustrating a configuration of a semiconductor device according to the first embodiment.

In a semiconductor device 100 according to the first embodiment, as illustrated in FIG. 5, a stacking structure of nitride semiconductors 105 is formed over a substrate 101. The stacking structure of nitride semiconductors 105 includes a first barrier layer 102; a channel layer 103 over the first barrier layer 102; and a second barrier layer 104 over the channel layer 103. The first barrier layer 102 contains AlN. The channel layer 103 contains BGaN. The second barrier layer 104 contains AlN. The difference between a first lattice constant $A_1$ of the channel layer 103 and a second lattice constant $A_2$ of the first barrier layer 102 is less than or equal to 1.55% of the second lattice constant $A_2$; namely, the following expression (3) holds.

$$|A_1-A_2|/A_2\times 100 \leq 1.55 \quad (3)$$

The first barrier layer 102 may also be referred to as the underlayer or the buffer layer. The channel layer 103 may also be referred to as the electron transit layer. The second barrier layer 104 may also be referred to as the electron supply layer or the cap layer.

The substrate 101 is, for example, a free-standing AlN substrate, and the upper surface of the substrate 101 is an Al polar face. In other words, the Miller index of the upper surface of the substrate 101 is (0001). The first barrier layer 102 is an AlN layer whose thickness is, for example, 50 nm to 500 nm. The channel layer 103 is a $B_xGa_{1-x}N$ layer ($0.05 \leq x \leq 0.20$) whose thickness is, for example, 8 nm to 12 nm. In other words, the channel layer 103 is a BGaN layer having the thickness of, for example, 8 nm to 12 nm and the B composition greater than or equal to 0.05 and less than or equal to 0.20. The second barrier layer 104 is an $AlyGa_{1-y}N$ layer ($0.40 \leq y \leq 1.00$) whose thickness is, for example, 4 nm to 20 nm. In other words, the second barrier layer 104 is an AlGaN layer having the thickness of, for example, 4 nm to 20 nm and the Al composition greater than or equal to 0.40 and less than or equal to 1.00. The thickness of the channel layer 103 is favorably less than or equal to 20 nm, and more favorably less than or equal to 10 nm. This is for obtaining an excellent quantum confinement effect. The Miller indices of the respective upper surfaces of the first barrier layer 102, the channel layer 103, and the second barrier layer 104 are also (0001).

The stacking structure of nitride semiconductors 105 has an element separation region formed to delimit an element region, and in the element region, an opening 104s for the source and an opening 104d for the drain are formed in the second barrier layer 104. In addition, a source electrode 106 is formed in the opening 104s, and a drain electrode 107 is formed in the opening 104d. Over the second barrier layer 104, a passivation film 108 is formed to cover the source electrode 106 and the drain electrode 107. An opening 108g located between the source electrode 106 and the drain electrode 107 in a planar view is formed in the passivation film 108, and a gate electrode 109 that contacts the second barrier layer 104 through the opening 108g is formed over the passivation film 108.

Each of the source electrode 106 and the drain electrode 107 includes, for example, a Ta film whose thickness is 10 nm to 50 nm, and over the Ta film, an Al film whose thickness is 100 nm to 500 nm, and forms an ohmic contact with the stacking structure of nitride semiconductors 105. The gate electrode 109 includes, for example, a Ni film whose thickness is 10 nm to 50 nm, and over the Ni film, an Au film whose thickness is 300 nm to 500 nm, and forms a Schottky contact with the stacking structure of nitride semiconductors 105. The passivation film 108 is a film of, for example, an oxide, nitride, or oxynitride of Si, Al, Hf, Zr, Ti, Ta, or W, and is favorably a film of Si nitride (SiN). The thickness of the passivation film 108 is, for example, 2 nm to 500 nm and favorably around 100 nm.

In the semiconductor device 100 configured in this way, a highly-concentrated two-dimensional electron gas (2DEG) 120 exists near the upper surface of the channel layer 103. Also, the first barrier layer 102 contains AlN, the channel layer 103 contains BGaN, the second barrier layer 104 contains AlN, and the lattice constant difference ΔA between the first barrier layer 102 and the channel layer 103 is less than or equal to 1.55%; therefore, the flatness of the surface of the channel layer 103 is excellent, and it is possible to obtain a great band offset. Consequently, it is possible to obtain an excellent quantum confinement effect with respect to the 2DEG 120.

Next, a method of manufacturing a semiconductor device 100 according to the first embodiment will be described. FIG. 6A to FIG. 6F are cross-sectional views illustrating a method of manufacturing the semiconductor device 100 according to the first embodiment in order of the processing steps.

Figure 6A:
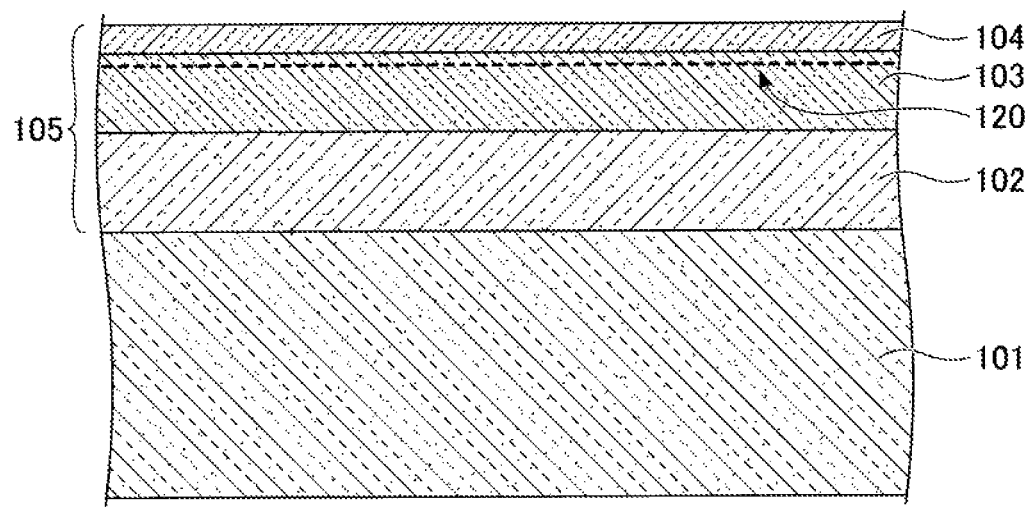
FIG. 6A is a first cross-sectional view illustrating a method of manufacturing a semiconductor device according to the first embodiment.

First, as illustrated in FIG. 6A, a stacking structure of nitride semiconductors 105 is formed over the (0001) surface of a substrate 101. When forming the stacking structure of nitride semiconductors 105, a first barrier layer 102, a channel layer 103, and a second barrier layer 104 are formed, for example, by a method of metal organic vapor phase epitaxy (MOVPE). When forming the stacking structure of nitride semiconductors 105, hydrogen ($H_2$) gas is used as the carrier gas. Also, as the source gas, for example, a mixed gas of triethyl boron (TEB) gas as the source of B, trimethyl aluminum (TMAl) gas as the source of Al, trimethyl gallium (TMGa) gas as the source of Ga, and ammonia ($NH_3$) gas as the source of N is used. At this time, depending on the composition of a nitride semiconductor layer to be grown up, whether to supply and the flow of the supply of the TEB gas, TMAl gas, and TMGa gas are set properly. For example, the growth pressure is set around 1 kPa to 100 kPa and the growth temperature is set around 700° C. to 1600° C. Formation of the second barrier layer 104 generates the 2DEG 120 near the upper surface of the channel layer 103.

Next, an element separation region to delimit an element region is formed in the stacking structure of nitride semiconductors 105. When forming the element separation region, for example, a pattern of a photoresist is formed to expose a region at which the element separation region is to be formed over the stacking structure of nitride semiconductors 105, and by using this pattern as the mask, ion implantation of Ar or the like is executed. By using this pattern as the etching mask, dry etching may be executed by using a chlorine-based gas.

Figure 6B:
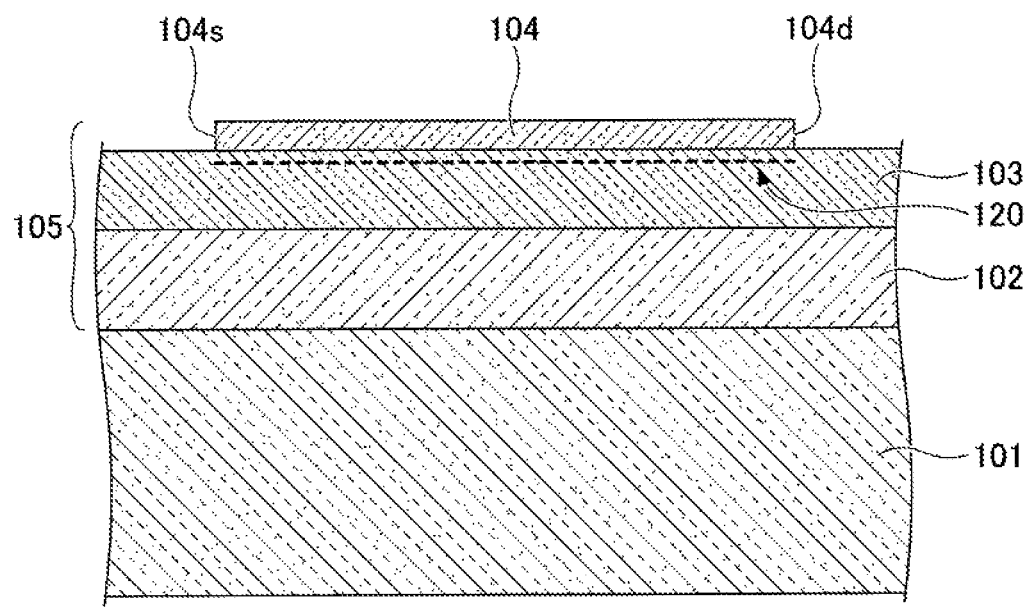
FIG. 6B is a second cross-sectional view illustrating the method of manufacturing the semiconductor device according to the first embodiment.

Thereafter, as illustrated in FIG. 6B, an opening 104s and an opening 104d are formed in the second barrier layer 104. When forming the opening 104s and the opening 104d, for example, a pattern of a photoresist is formed to expose regions at which the opening 104s and the opening 104d are to be formed by photolithography over the stacking structure of nitride semiconductors 105, and by using this pattern as the etching mask, dry etching is executed by using a chlorine-based gas.

Figure 6C:
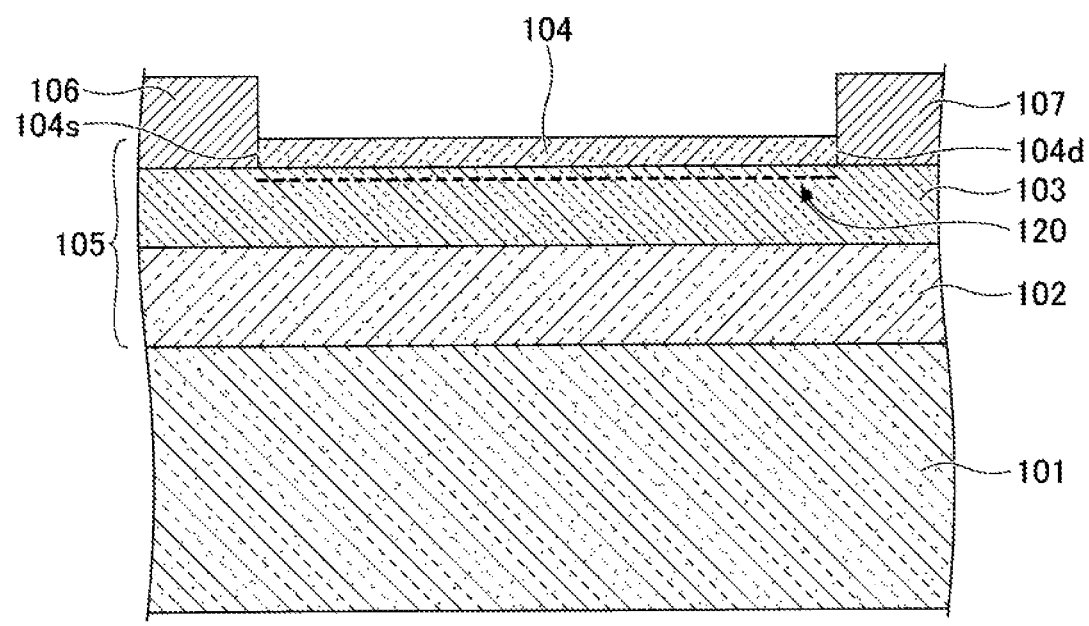
FIG. 6C is a third cross-sectional view illustrating the method of manufacturing the semiconductor device according to the first embodiment.

Next, as illustrated in FIG. 6C, a source electrode 106 is formed in the opening 104s, and a drain electrode 107 is formed in the opening 104d. The source electrode 106 and the drain electrode 107 may be formed, for example, by a lift-off method. In other words, a pattern of a photoresist is formed to expose regions at which the source electrode 106 and the drain electrode 107 are to be formed, and by using this pattern as the growth mask, a metal film is formed by a method of vapor-depositing, and then, this pattern is removed together with the metal film over it. When forming the metal film, for example, a Ta film is formed, and an Al film is formed over it. Next, a heat treatment is applied, for example, in a nitrogen atmosphere at 400° C. to 1000° C. (e.g., at 550° C.), to establish an ohmic characteristic.

Figure 6D:
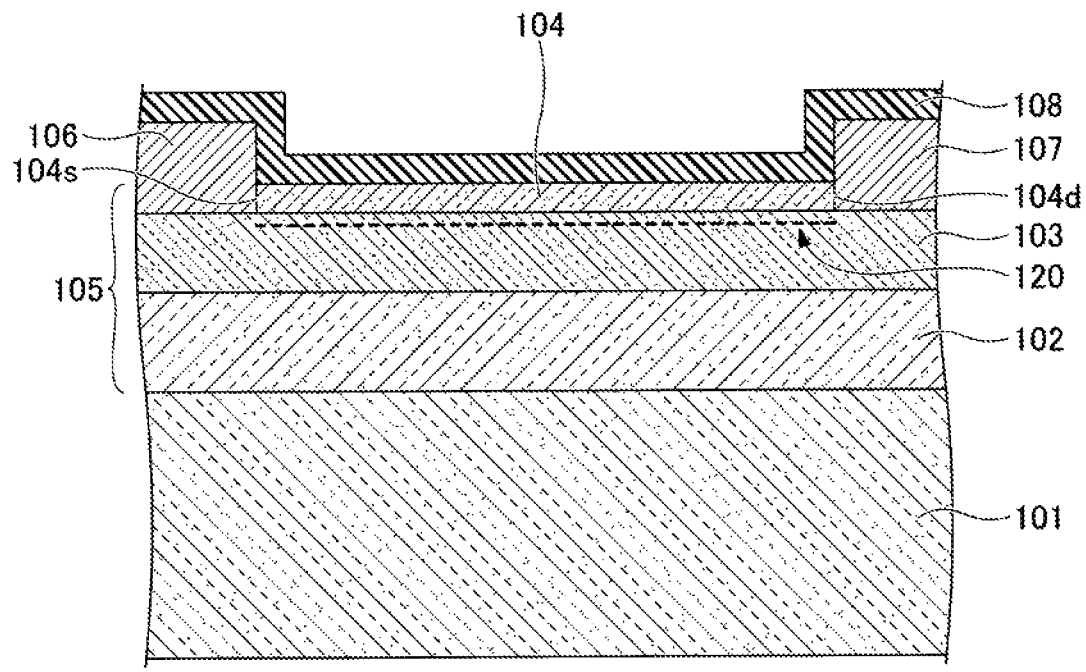
FIG. 6D is a fourth cross-sectional view illustrating the method of manufacturing the semiconductor device according to the first embodiment.

Thereafter, as illustrated in FIG. 6D, a passivation film 108 is formed over the second barrier layer 104, to cover the source electrode 106 and the drain electrode 107. The passivation film 108 is formed, for example, by a method of chemical vapor deposition (CVD). The passivation film 108 may be formed by a method of atomic layer deposition (ALD) or a sputtering method.

Figure 6E:
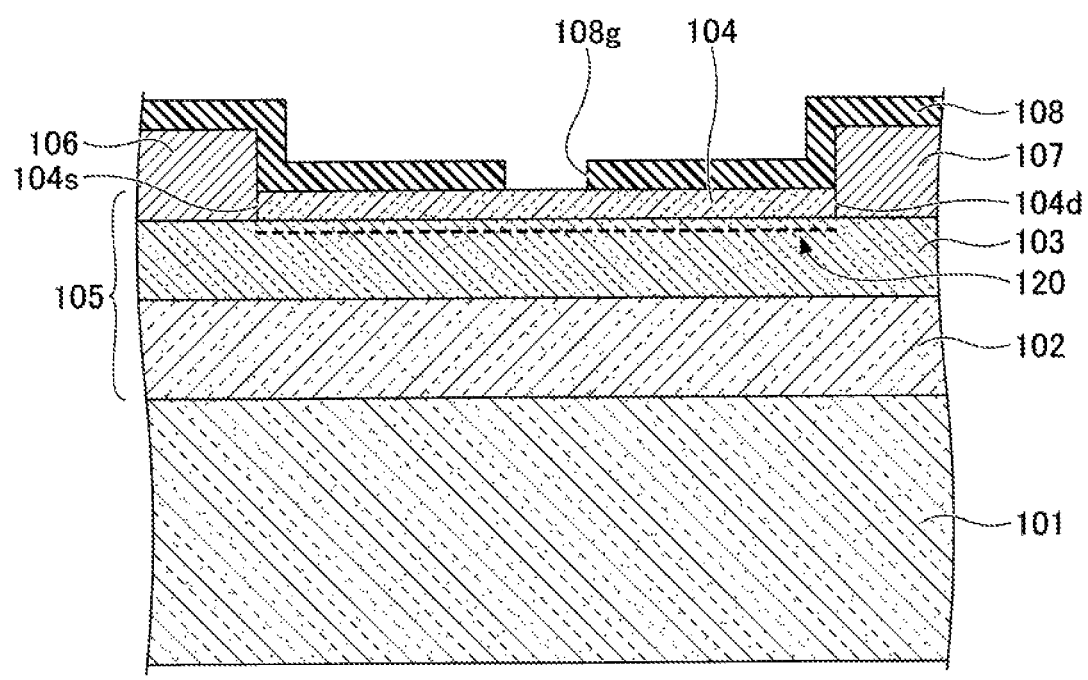
FIG. 6E is a fifth cross-sectional view illustrating the method of manufacturing the semiconductor device according to the first embodiment.

Next, as illustrated in FIG. 6E, an opening 108g is formed in the passivation film 108. When forming the opening 108g, for example, a pattern of a photoresist is formed to expose a region at which the opening 108g is to be formed by photolithography over the passivation film 108, and by using this pattern as the etching mask, dry etching is executed by using a fluorine-based gas or a chlorine-based gas. Instead of dry etching, wet etching may be executed using a hydrofluoric acid or a buffered hydrofluoric acid.

Figure 6F:
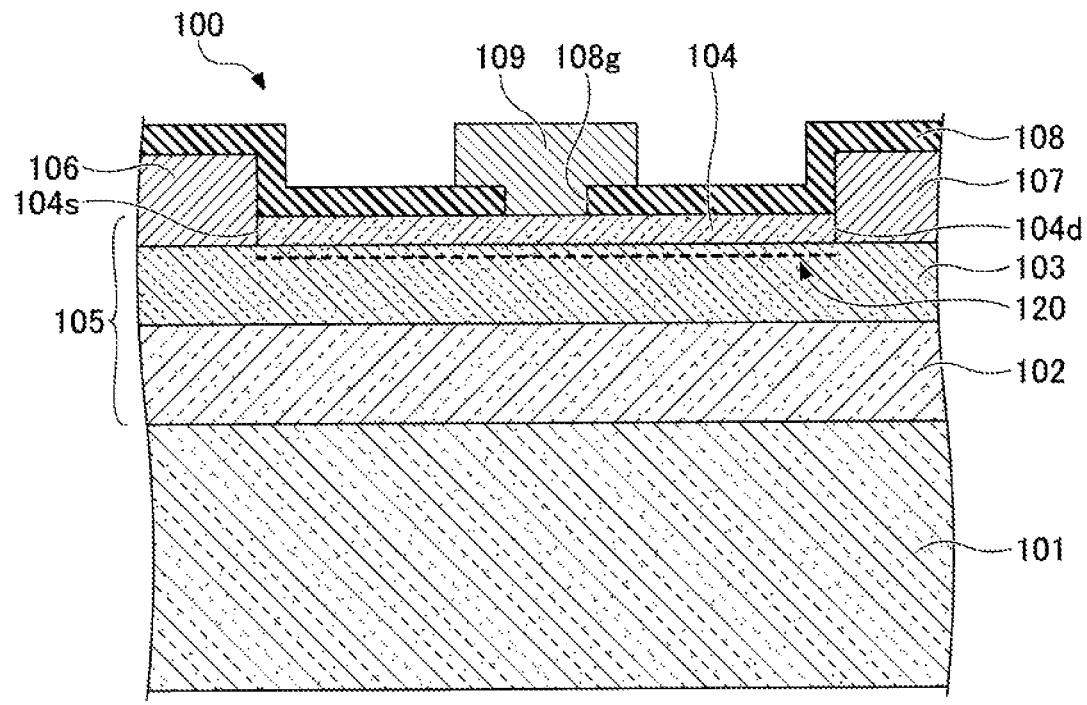
FIG. 6F is a sixth cross-sectional view illustrating the method of manufacturing the semiconductor device according to the first embodiment.

Next, as illustrated in FIG. 6F, a gate electrode 109 is formed over the passivation film 108, to contact the second barrier layer 104 through the opening 108g. The gate electrode 109 may be formed, for example, by a lift-off method. In other words, a pattern of a photoresist is formed to expose a region at which the gate electrode 109 is to be formed, and by using this pattern as the growth mask, a metal film is formed by a method of vapor-depositing, and then, this pattern is removed together with the metal film over it. When forming the metal film, for example, a Ni film is formed and an Au film is formed over it.

In this way, it is possible to manufacture a semiconductor device 100 according to the first embodiment.

Second Embodiment

Figure 7:
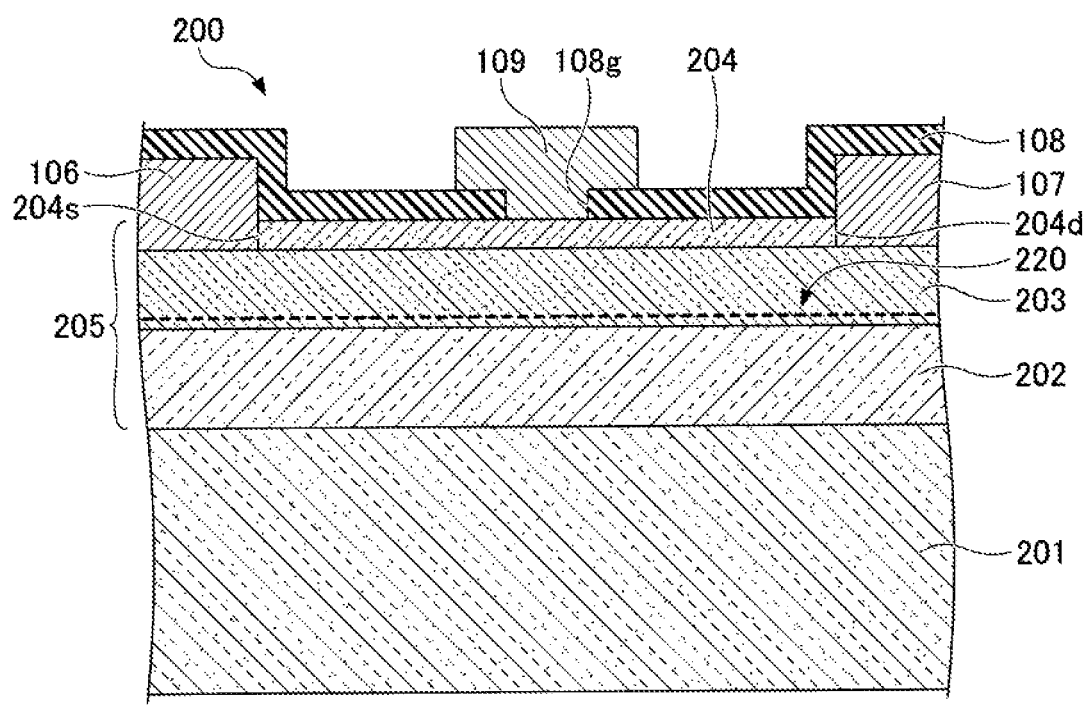
FIG. 7 is a cross-sectional view illustrating a configuration of a semiconductor device according to a second embodiment.

Next, a second embodiment will be described. The second embodiment relates to a semiconductor device that includes a HEMT having a quantum confinement structure. FIG. 7 is a cross-sectional view illustrating a configuration of a semiconductor device according to the second embodiment.

In a semiconductor device 200 according to the second embodiment, as illustrated in FIG. 7, a stacking structure of nitride semiconductors 205 includes a first barrier layer 202; a channel layer 203 over the first barrier layer 202; and a second barrier layer 204 over the channel layer 203. The first barrier layer 202 contains AlN. The channel layer 203 contains BGaN. The second barrier layer 204 contains AlN. The difference between a first lattice constant A1 of the channel layer 203 and a second lattice constant A2 of the first barrier layer 202 is less than or equal to 1.55% of the second lattice constant A2; namely, the above expression (3) holds.

The first barrier layer 202 may also be referred to as the electron supply layer, the underlayer, or the buffer layer. The channel layer 203 may also be referred to as the electron transit layer. The second barrier layer 204 may also be referred to as the cap layer.

A substrate 201 is, for example, a free-standing AlN substrate; unlike in the first embodiment, the upper surface of the substrate 201 is an N polar face. In other words, the Miller index of the upper surface of the substrate 201 is (000-1). The first barrier layer 202 is an AlN layer whose thickness is, for example, 50 nm to 500 nm. The channel layer 203 is a $B_xGa_{1-x}N$ layer ($0.05 \leq x \leq 0.20$) whose thickness is, for example, 8 nm to 12 nm. In other words, the channel layer 203 is a BGaN layer having the thickness of, for example, 8 nm to 12 nm and the B composition greater than or equal to 0.05 and less than or equal to 0.20. The second barrier layer 204 is an $Al_yGa_{1-y}N$ layer ($0.40 \leq y \leq 1.00$) whose thickness is, for example, 4 nm to 20 nm. In other words, the second barrier layer 204 is an AlGaN layer having the thickness of, for example, 4 nm to 20 nm and the Al composition greater than or equal to 0.40 and less than or equal to 1.00. The thickness of the channel layer 203 is favorably less than or equal to 20 nm, and more favorably less than or equal to 20 nm. This is for obtaining an excellent quantum confinement effect. The Miller indices of the respective upper surfaces of the first barrier layer 202, the channel layer 203, and the second barrier layer 204 are also (000-1).

The stacking structure of nitride semiconductors 205 has an element separation region formed to delimit an element region, and in the element region, an opening 204s for the source and an opening 204d for the drain are formed in the second barrier layer 204. In addition, a source electrode 106 is formed in the opening 204s, and a drain electrode 107 is formed in the opening 204d. Over the second barrier layer 204, a passivation film 108 is formed to cover the source electrode 106 and the drain electrode 107. An opening 108g located between the source electrode 106 and the drain electrode 107 in a planar view is formed in the passivation film 108, and a gate electrode 109 that contacts the second barrier layer 204 through the opening 108g is formed over the passivation film 108.

In the semiconductor device 200 configured in this way, a 2DEG 220 exists near the lower surface of the channel layer 203. Also, the first barrier layer 202 contains AlN, the channel layer 203 contains BGaN, the second barrier layer 204 contains AlN, and the lattice constant difference ΔA between the first barrier layer 202 and the channel layer 203 is less than or equal to 1.55%; therefore, the flatness of the surface of the channel layer 203 is excellent, and it is possible to obtain a great band offset. Consequently, it is possible to obtain an excellent quantum confinement effect with respect to the 2DEG 220.

Next, a method of manufacturing a semiconductor device 200 according to the second embodiment will be described. FIG. 8A to FIG. 8F are cross-sectional views illustrating a method of manufacturing a semiconductor device 200 according to the second embodiment in order of the processing steps.

Figure 8A:
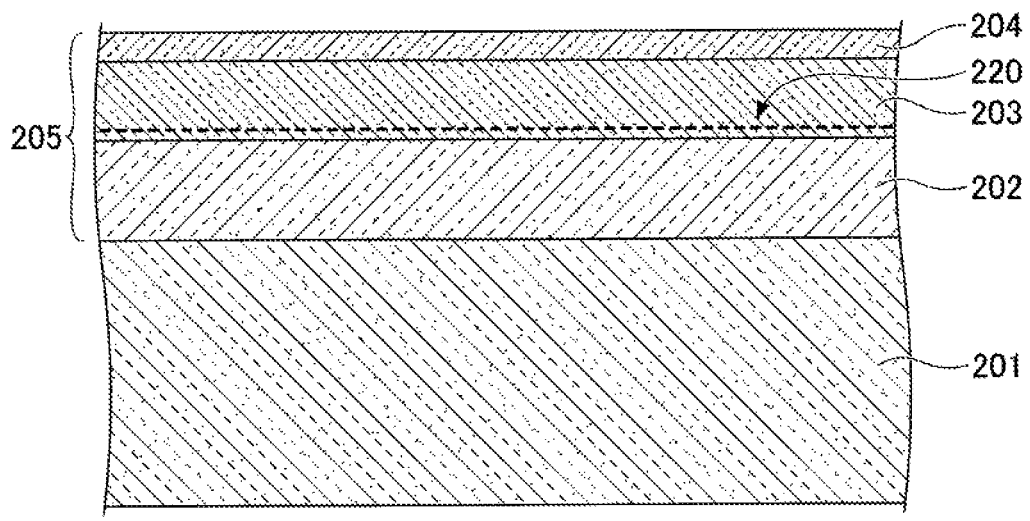
FIG. 8A is a first cross-sectional view illustrating a method of manufacturing a semiconductor device according to the second embodiment.

First, as illustrated in FIG. 8A, a stacking structure of nitride semiconductors 205 is formed over the (000-1) surface of a substrate 201. When forming the stacking structure of nitride semiconductors 205, a first barrier layer 202, a channel layer 203, and a second barrier layer 204 are formed, for example, by a method of MOVPE. When forming the stacking structure of nitride semiconductors 205, hydrogen ($H_2$) gas is used as the carrier gas. Also, as the source gas, for example, a mixed gas of TEB gas, TMAl gas, TMGa gas, and $NH_3$ gas is used. At this time, depending on the composition of a nitride semiconductor layer to be grown up, whether to supply and the flow of the supply of the TEB gas, TMAl gas, and TMGa gas are set properly. For example, the growth pressure is set around 1 kPa to 100 kPa and the growth temperature is set around 700° C. to 1600° C. Formation of the channel layer 203 generates the 2DEG 220 near the lower surface of the channel layer 203.

Next, as in the first embodiment, an element separation region to delimit an element region is formed in the stacking structure of nitride semiconductors 205.

Figure 8B:
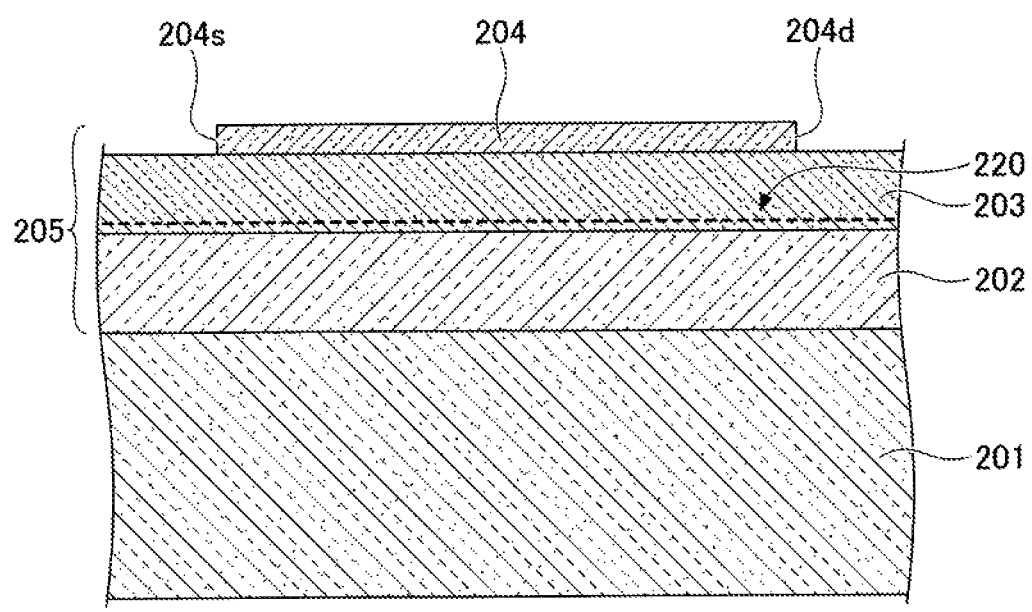
FIG. 8B is a second cross-sectional view illustrating the method of manufacturing the semiconductor device according to the second embodiment.

Thereafter, as illustrated in FIG. 8B, as in the first embodiment, an opening 204s and an opening 204d are formed in the second barrier layer 204.

Figure 8C:
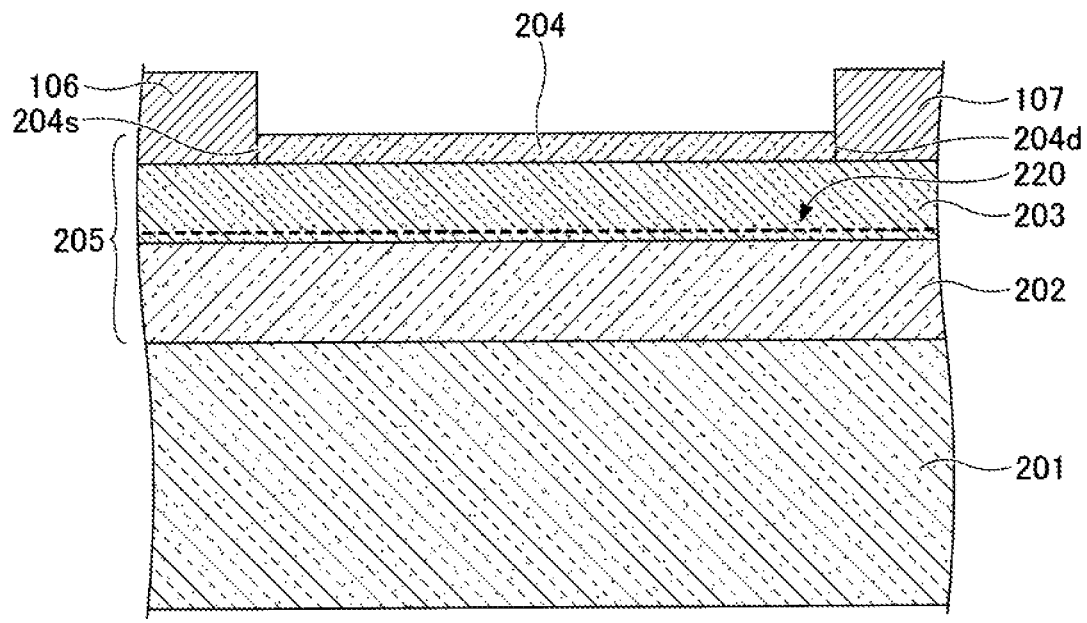
FIG. 8C is a third cross-sectional view illustrating the method of manufacturing the semiconductor device according to the second embodiment.

Next, as illustrated in FIG. 8C, as in the first embodiment, a source electrode 106 is formed in the opening 204s, and a drain electrode 107 is formed in the opening 204d. Next, a heat treatment is applied, for example, in a nitrogen atmosphere at 400° C. to 1000° C. (e.g., at 550° C.), to establish an ohmic characteristic.

Figure 8D:
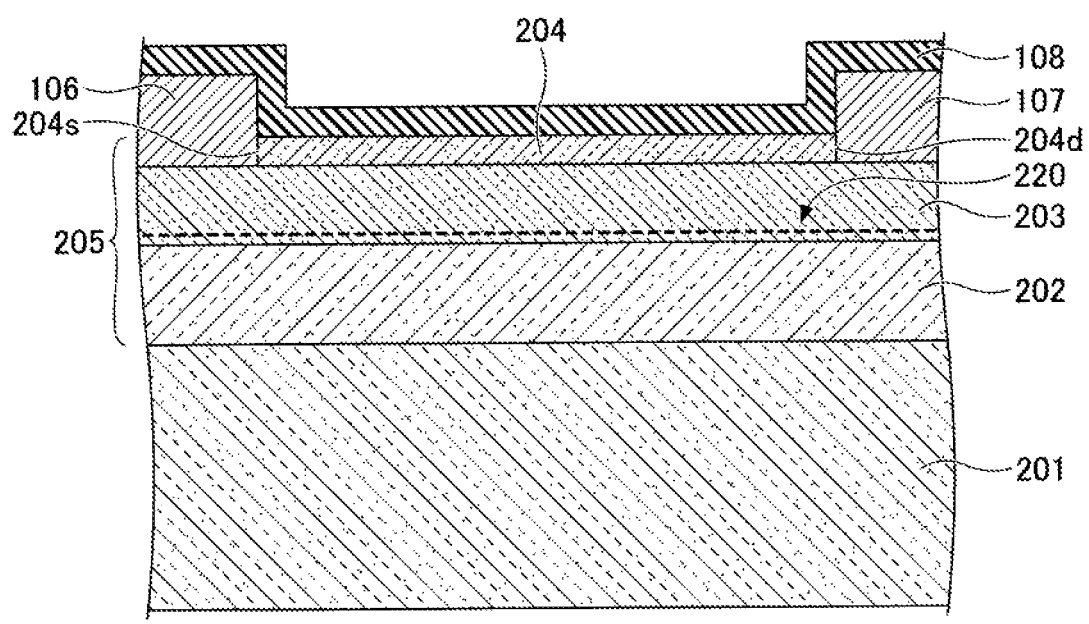
FIG. 8D is a fourth cross-sectional view illustrating the method of manufacturing the semiconductor device according to the second embodiment.
Figure 8E:
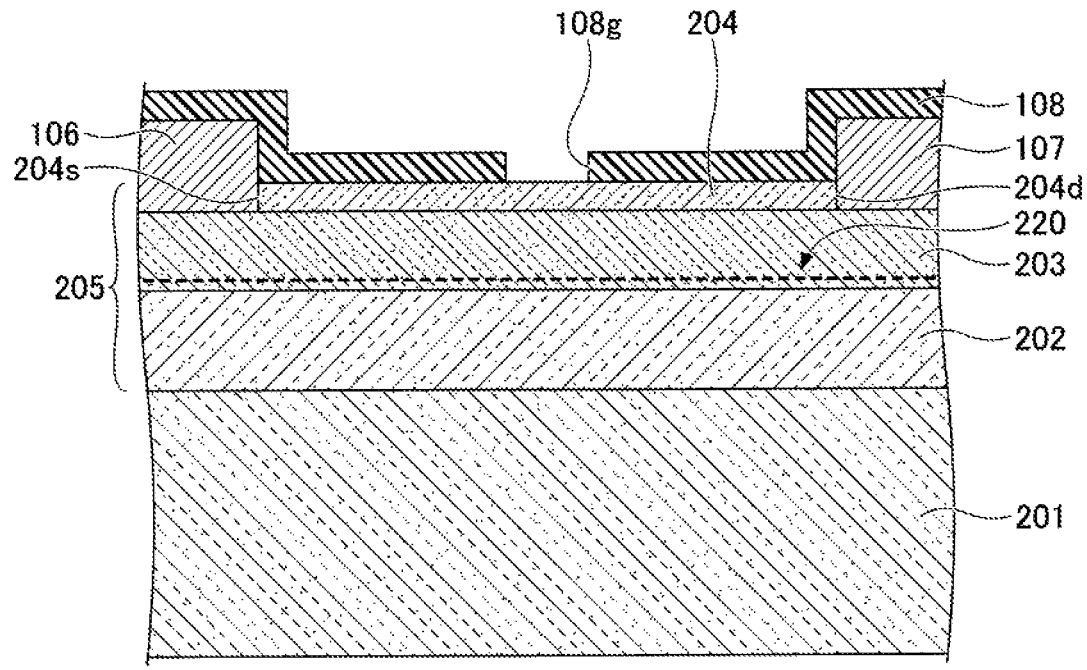
FIG. 8E is a fifth cross-sectional view illustrating the method of manufacturing the semiconductor device according to the second embodiment.
Figure 8F:
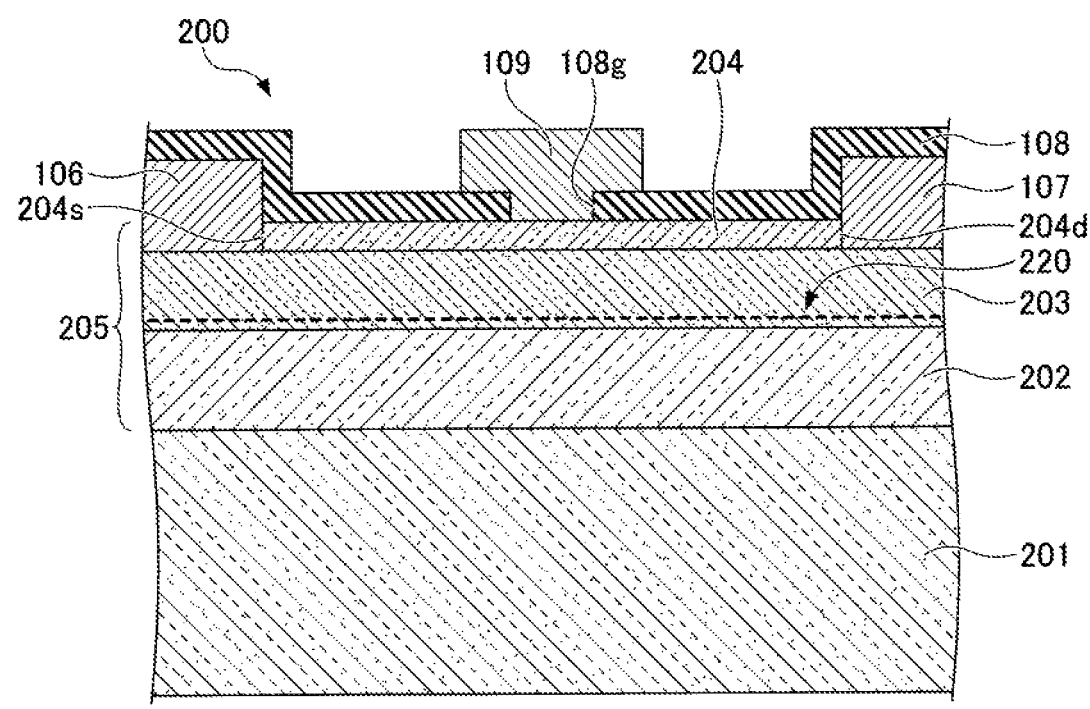
FIG. 8F is a sixth cross-sectional view illustrating the method of manufacturing the semiconductor device according to the second embodiment.

Thereafter, as illustrated in FIG. 8D, as in the first embodiment, a passivation film 108 is formed over the second barrier layer 204, to cover the source electrode 106 and the drain electrode 107. Next, as illustrated in FIG. 8E, as in the first embodiment, an opening 108g is formed in the passivation film 108. Next, as illustrated in FIG. 8F, as in the first embodiment, a gate electrode 109 is formed over the passivation film 108, to contact the second barrier layer 204 through the opening 108g.

In this way, it is possible to manufacture a semiconductor device 200 according to the second embodiment.

The second embodiment is superior to the first embodiment in terms of reduction of the contact resistance, whereas the first embodiment is superior to the second embodiment in terms of the ease of forming of a stacking structure of nitride semiconductors (the ease of forming of a nitride semiconductor layer).

Third Embodiment

Figure 9:
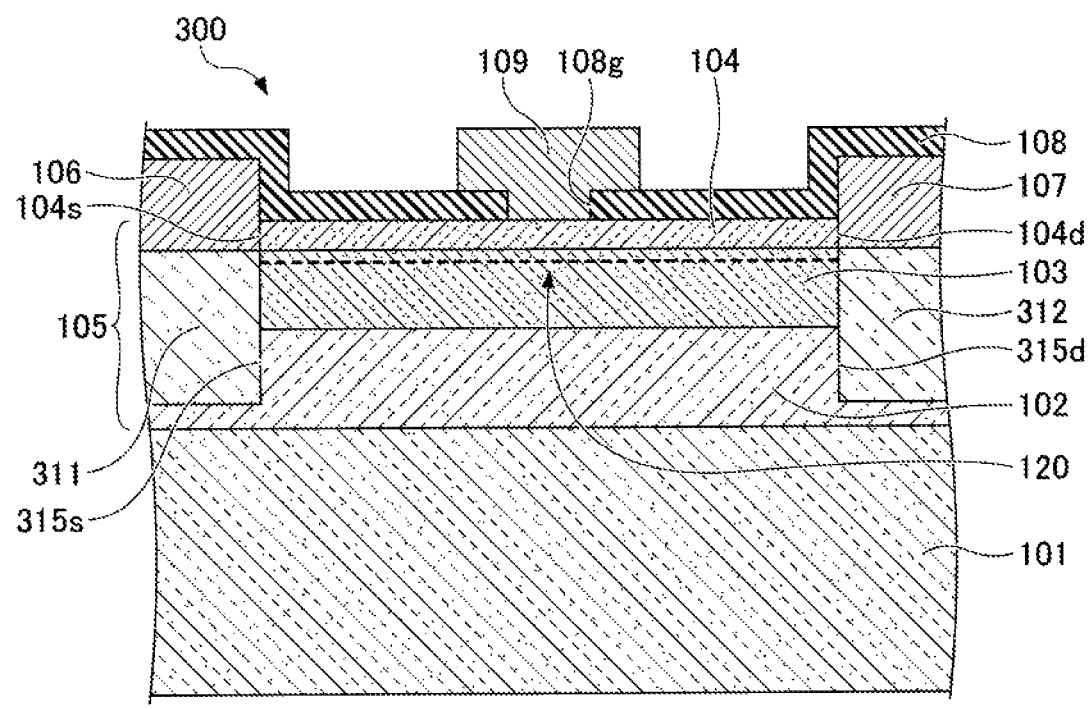
FIG. 9 is a cross-sectional view illustrating a configuration of a semiconductor device according to a third embodiment.

Next, a third embodiment will be described. The third embodiment relates to a semiconductor device that includes a HEMT having a quantum confinement structure. FIG. 9 is a cross-sectional view illustrating a configuration of a semiconductor device according to the third embodiment.

In a semiconductor device 300 according to the third embodiment, as illustrated in FIG. 9, as in the first embodiment, a stacking structure of nitride semiconductors 105 is formed over a substrate 101, and an opening 104s and an opening 104d are formed in the second barrier layer 104. In the stacking structure of nitride semiconductors 105, a recess 315s is formed to be aligned with the opening 104s, and a recess 315d is formed to be aligned with the opening 104d. The bottoms of the recess 315s and the recess 315d are located between the interface of the substrate 101 and the first barrier layer 102, and the interface of the first barrier layer 102 and the channel layer 103. A contact layer 311 is formed in the recess 315s, and a contact layer 312 is formed in the recess 315d. The contact layer 311 and the contact layer 312 contact the channel layer 103.

As in the first embodiment, a source electrode 106 is formed in the opening 104s, and a drain electrode 107 is formed in the opening 104d. The source electrode 106 contacts the contact layer 311, and the drain electrode 107 contacts the contact layer 312. Each of the contact layer 311 and the contact layer 312 is an n-type GaN layer whose thickness is, for example, 40 nm to 60 nm. This n-type GaN layer is, for example, Si-doped at a concentration around $1 \times 10^{19}$ cm$^{-3}$. The semiconductor device 300 includes the passivation film 108 and the gate electrode 109 as in the first embodiment.

In the semiconductor device 300 configured in this way, as in the first embodiment, a 2DEG 120 exists near the upper surface of the channel layer 103. Also, the first barrier layer 102 contains AlN, the channel layer 103 contains BGaN, the second barrier layer 104 contains AlN, and the lattice constant difference ΔA between the first barrier layer 102 and the channel layer 103 is less than or equal to 1.55%; therefore, the flatness of the surface of the channel layer 103 is excellent, and it is possible to obtain a great band offset. Consequently, it is possible to obtain an excellent quantum confinement effect with respect to the 2DEG 120.

Furthermore, since the contact layer 311 and the contact layer 312 are formed to contact the source electrode 106 and the drain electrode 107, it is possible to reduce the contact resistance further than in the first embodiment.

Next, a method of manufacturing a semiconductor device 300 according to the third embodiment will be described. FIG. 10A to FIG. 10H are cross-sectional views illustrating a method of manufacturing a semiconductor device 300 according to the third embodiment in order of the processing steps.

Figure 10A:
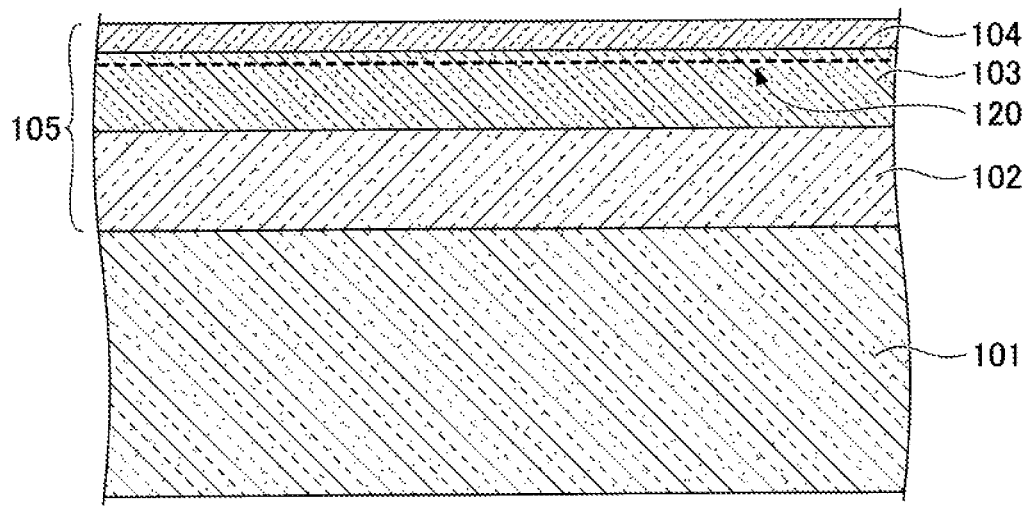
FIG. 10A is a first cross-sectional view illustrating a method of manufacturing a semiconductor device according to the third embodiment.

First, as illustrated in FIG. 10A, a stacking structure of nitride semiconductors 105 is formed over the (0001) surface of a substrate 101. When forming the stacking structure of nitride semiconductors 105, as in the first embodiment, a first barrier layer 102, the channel layer 103, and the second barrier layer 104 are formed, for example, by a method of MOVPE. Formation of the second barrier layer 104 generates a 2DEG 120 near the upper surface of the channel layer 103.

Figure 10B:
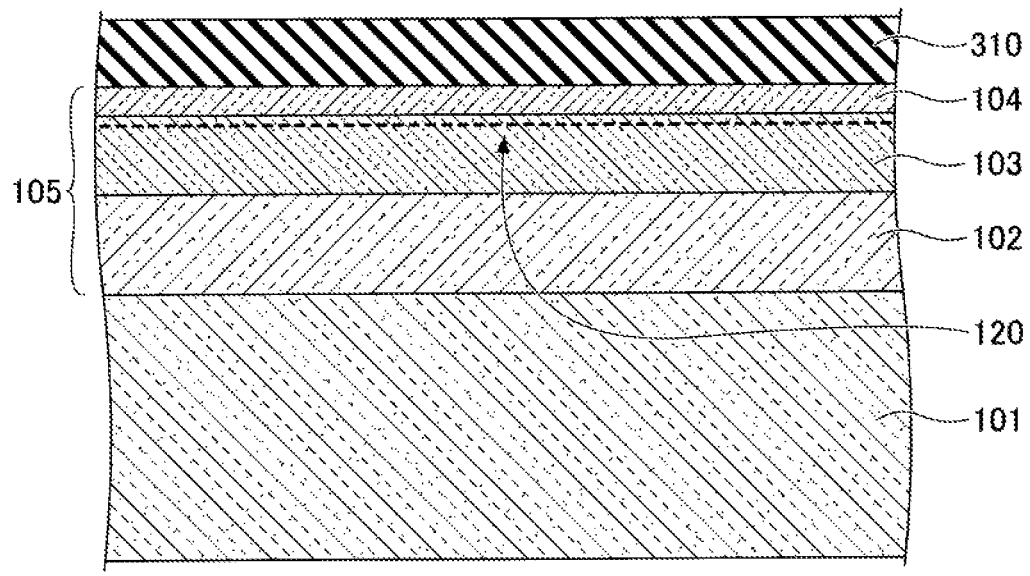
FIG. 10B is a second cross-sectional view illustrating the method of manufacturing the semiconductor device according to the third embodiment.

Next, as illustrated in FIG. 10B, a surface protection film 310 is formed over the second barrier layer 104. The surface protection film 310 is a film of, for example, an oxide, nitride, or oxynitride of Si, Al, Hf, Zr, Ti, Ta, or W, and is favorably a film of Si oxide ($SiO_2$). The surface protection film 310 is formed, for example by a method of plasma CVD. The surface protection film 310 may be formed by an ALD method or a sputtering method.

Figure 10C:
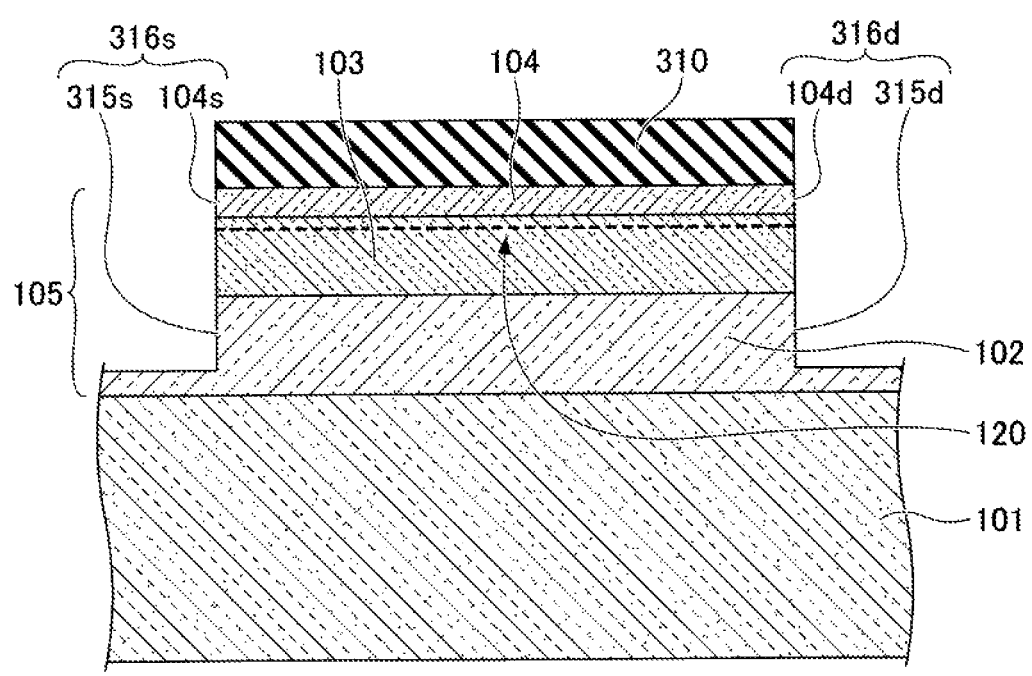
FIG. 10C is a third cross-sectional view illustrating the method of manufacturing the semiconductor device according to the third embodiment.

Thereafter, as illustrated in FIG. 10C, in the surface protection film 310 and the stacking structure of nitride semiconductors, in a region at which a source electrode 106 is to be formed, a recess 316s is formed, and in a region at which a drain electrode 107 is to be formed, a recess 316d is formed. The bottoms of the recess 316s and the recess 316d are located between the interface of the substrate 101 and the first barrier layer 102, and the interface of the first barrier layer 102 and the channel layer 103; the recess 316s includes an opening 104s and a recess 315s; and the recess 316d includes an opening 104d and a recess 315d. When forming the recess 316s and the recess 316d, for example, a pattern of a photoresist is formed to expose regions at which the recess 316s and the recess 316d are to be formed by photolithography over the surface protection film 310, and by using this pattern as the etching mask, dry etching is executed by using a fluorine-based gas or a chlorine-based gas.

Figure 10D:
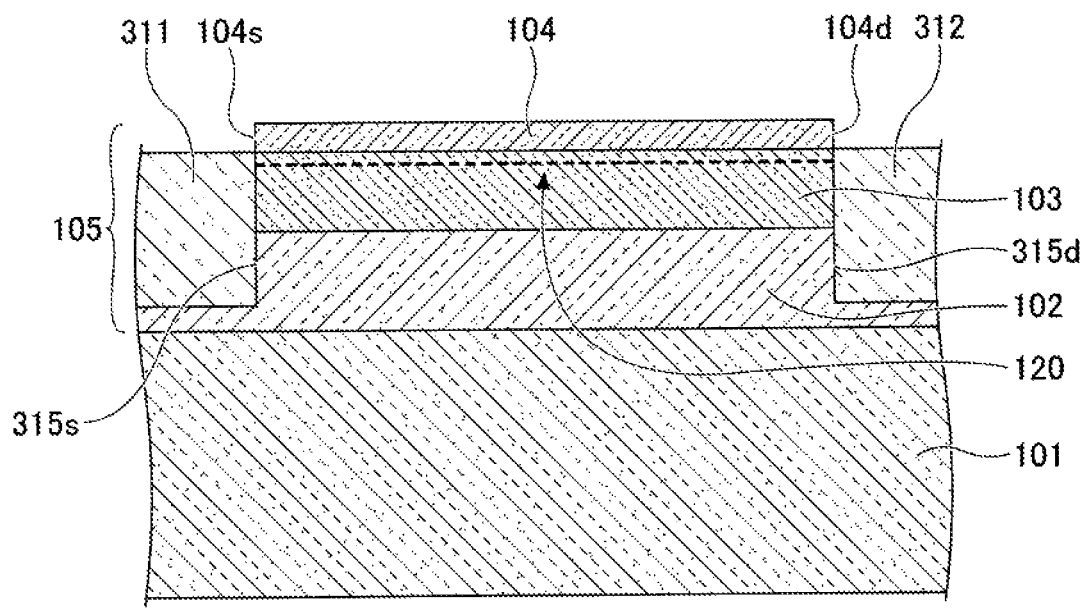
FIG. 10D is a fourth cross-sectional view illustrating the method of manufacturing the semiconductor device according to the third embodiment.

Next, as illustrated in FIG. 10D, a contact layer 311 is formed in the recess 315s, and the contact layer 312 is formed in the recess 315d. The contact layer 311 and the contact layer 312 are formed, for example, by a method of MOVPE. When forming the contact layer 311 and the contact layer 312, hydrogen ($H_2$) gas is used as the carrier gas; and as the source gas, a mixed gas of TMGa gas and NH3 gas is used. At this time, in order to make the contact layer 311 and the contact layer 312 an n-type, for example, a silane ($SiH_4$) gas including Si is added to the mixed gas by a predetermined flow, so as to dope the contact layer 311 and the contact layer 312 with Si. For example, the growth pressure is set around 1 kPa to 100 kPa, and the growth temperature is set around 700° C. to 1600° C. After having the contact layer 311 and the contact layer 312 formed, the surface protection film 310 is removed.

Figure 10E:
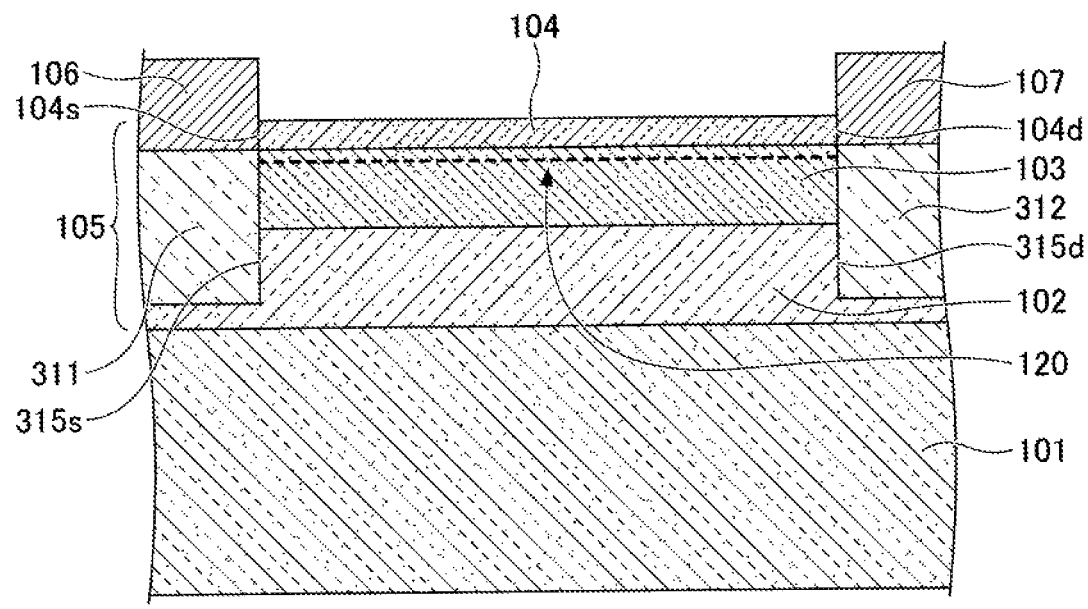
FIG. 10E is a fifth cross-sectional view illustrating the method of manufacturing the semiconductor device according to the third embodiment.

Next, as illustrated in FIG. 10E, as in the first embodiment, the source electrode 106 is formed in the opening 104s, and the drain electrode 107 is formed in the opening 104d. Next, a heat treatment is applied, for example, in a nitrogen atmosphere at 400° C. to 1000° C. (e.g., at 550° C.), to establish an ohmic characteristic.

Figure 10F:
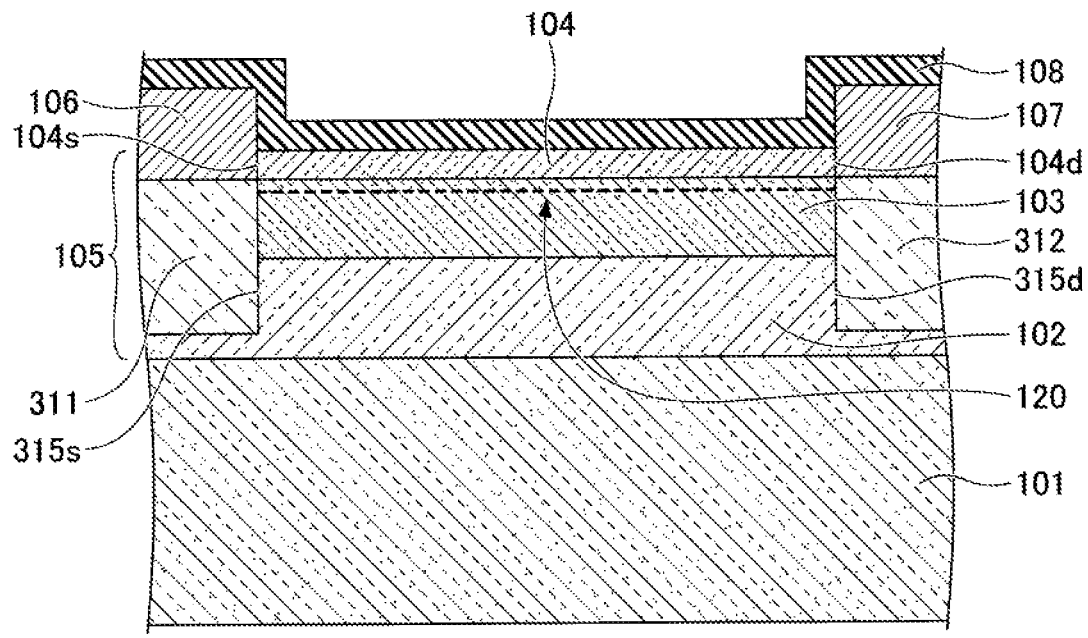
FIG. 10F is a sixth cross-sectional view illustrating the method of manufacturing the semiconductor device according to the third embodiment.
Figure 10G:
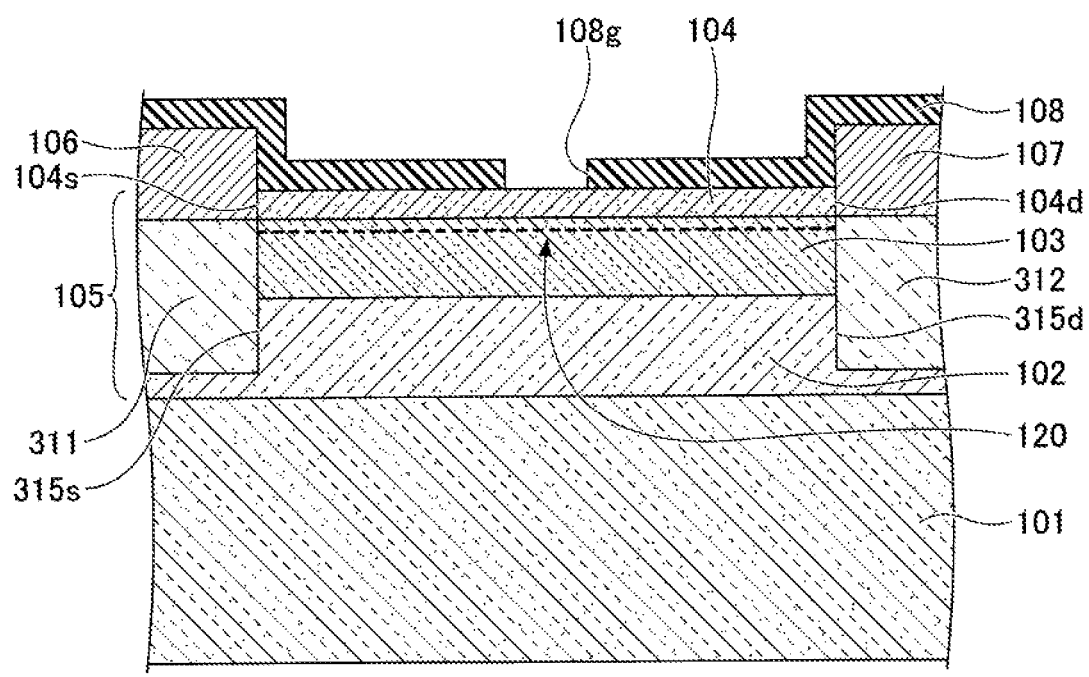
FIG. 10G is a seventh cross-sectional view illustrating the method of manufacturing the semiconductor device according to the third embodiment.
Figure 10H:
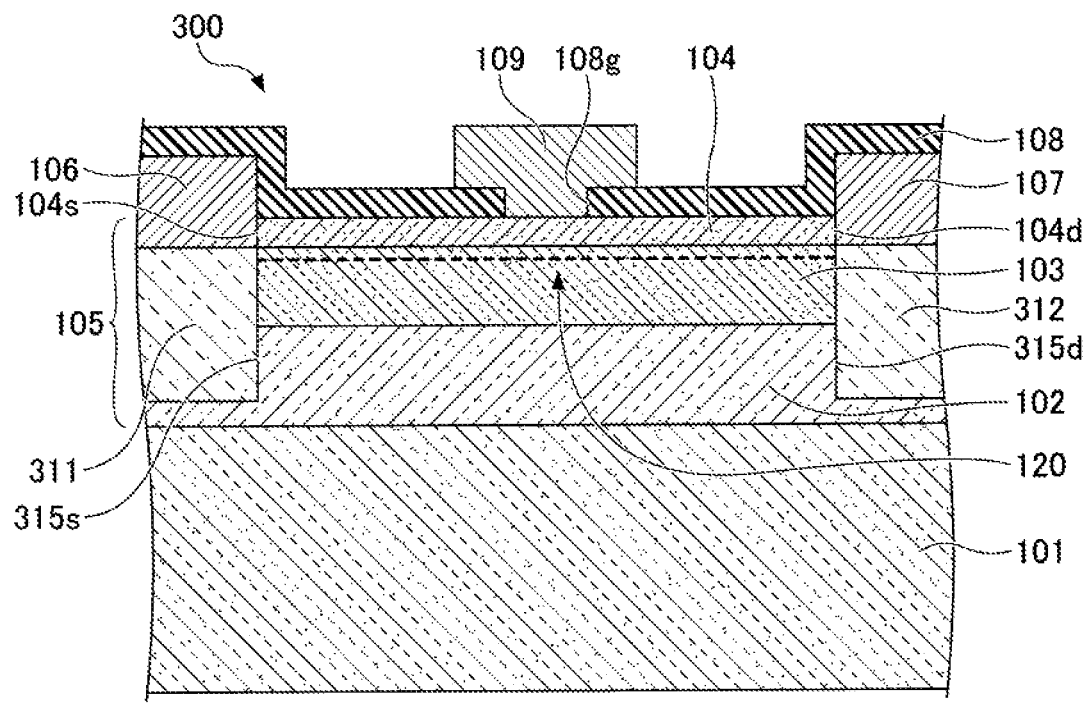
FIG. 10H is an eighth cross-sectional view illustrating the method of manufacturing the semiconductor device according to the third embodiment.

Thereafter, as illustrated in FIG. 10F, as in the first embodiment, a passivation film 108 is formed over the second barrier layer 104, to cover the source electrode 106 and the drain electrode 107. Next, as illustrated in FIG. 10G, as in the first embodiment, an opening 108g is formed in the passivation film 108. Next, as illustrated in FIG. 10H, as in the first embodiment, a gate electrode 109 is formed over the passivation film 108, to contact the second barrier layer 104 through the opening 108g.

In this way, it is possible to manufacture a semiconductor device 300 according to the third embodiment.

Fourth Embodiment

Figure 11:
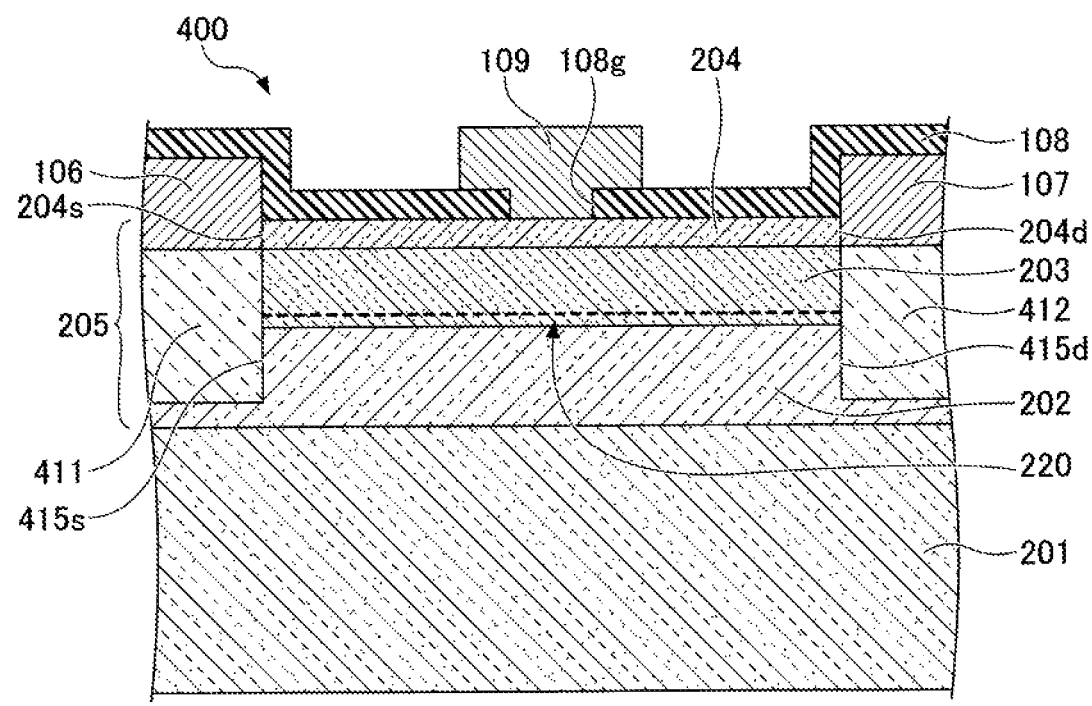
FIG. 11 is a cross-sectional view illustrating a configuration of a semiconductor device according to a fourth embodiment.

Next, a fourth embodiment will be described. The fourth embodiment relates to a semiconductor device that includes a HEMT having a quantum confinement structure. FIG. 11 is a cross-sectional view illustrating a configuration of a semiconductor device according to the fourth embodiment.

As illustrated in FIG. 11, a semiconductor device 400 according to the fourth embodiment has a configuration that combines the second embodiment with the third embodiment. In other words, a recess 415s is formed to be aligned with an opening 204s in a stacking structure of nitride semiconductors 205, and a recess 415d is formed to be aligned with an opening 204d. The bottoms of the recess 415s and the recess 415d are located between the interface of a substrate 201 and a first barrier layer 202, and the interface of the first barrier layer 202 and a channel layer 203. A contact layer 411 is formed in the recess 415s, and a contact layer 412 is formed in the recess 415d. The contact layer 411 and the contact layer 412 contact the channel layer 203.

As in the second embodiment, a source electrode 106 is formed in an opening 204s, and a drain electrode 107 is formed in an opening 204d. The source electrode 106 contacts the contact layer 411, and the drain electrode 107 contacts the contact layer 412. The contact layer 411 and the contact layer 412 are n-type GaN layers whose thickness is, for example, 40 nm to 60 nm. This n-type GaN layer is, for example, Si-doped at a concentration around $1 \times 10^{19}$ cm$^{-3}$. The semiconductor device 400 includes a passivation film 108 and a gate electrode 109 as in the second embodiment.

In the semiconductor device 400 configured in this way, as in the second embodiment, a 2DEG 220 exists near the lower surface of the channel layer 203. Also, the first barrier layer 202 contains AlN, the channel layer 203 contains BGaN, the second barrier layer 204 contains AlN, and the lattice constant difference ΔA between the first barrier layer 202 and the channel layer 203 is less than or equal to 1.55%; therefore, the flatness of the surface of the channel layer 203 is excellent, and it is possible to obtain a great band offset. Consequently, it is possible to obtain an excellent quantum confinement effect with respect to the 2DEG 220.

Furthermore, since the contact layer 411 and the contact layer 412 are formed to contact the source electrode 106 and the drain electrode 107, it is possible to reduce the contact resistance further than in the second embodiment.

Similar to the method of manufacturing a semiconductor device 300, it is possible to manufacture a semiconductor device 400 by adding formation of a recess 415s and a recess 415d; formation of a contact layer 411 and a contact layer 412; and the like, to the method of manufacturing a semiconductor device 200.

Figure 12:
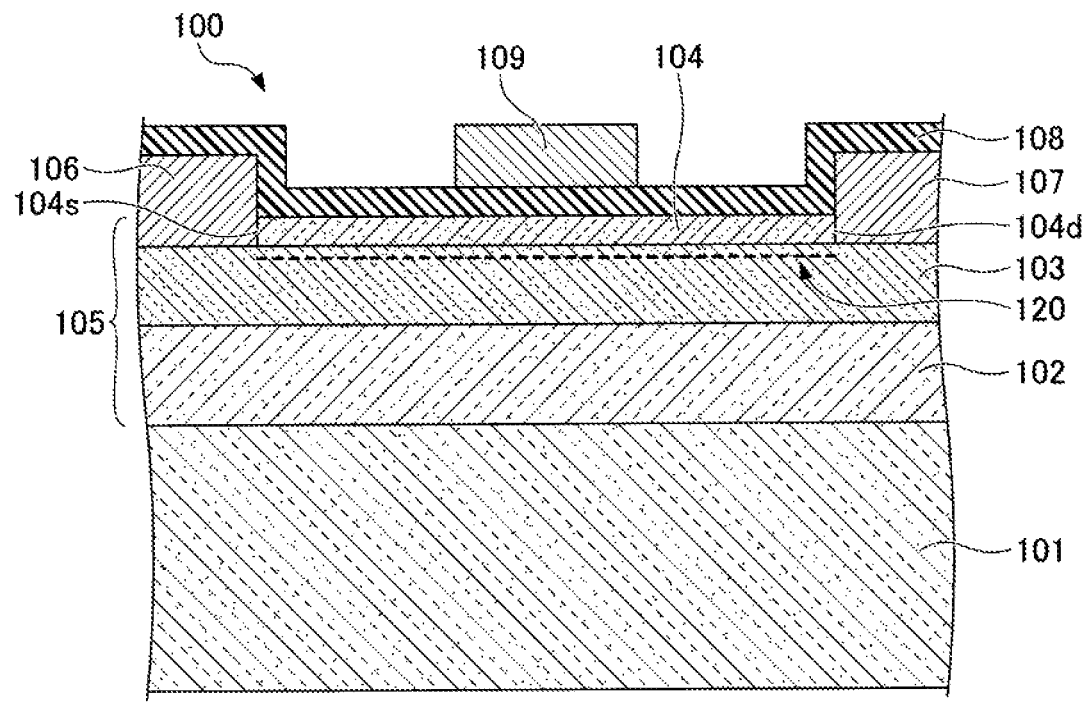
FIG. 12 is a cross-sectional view illustrating a modified example of the first embodiment.
Figure 13:
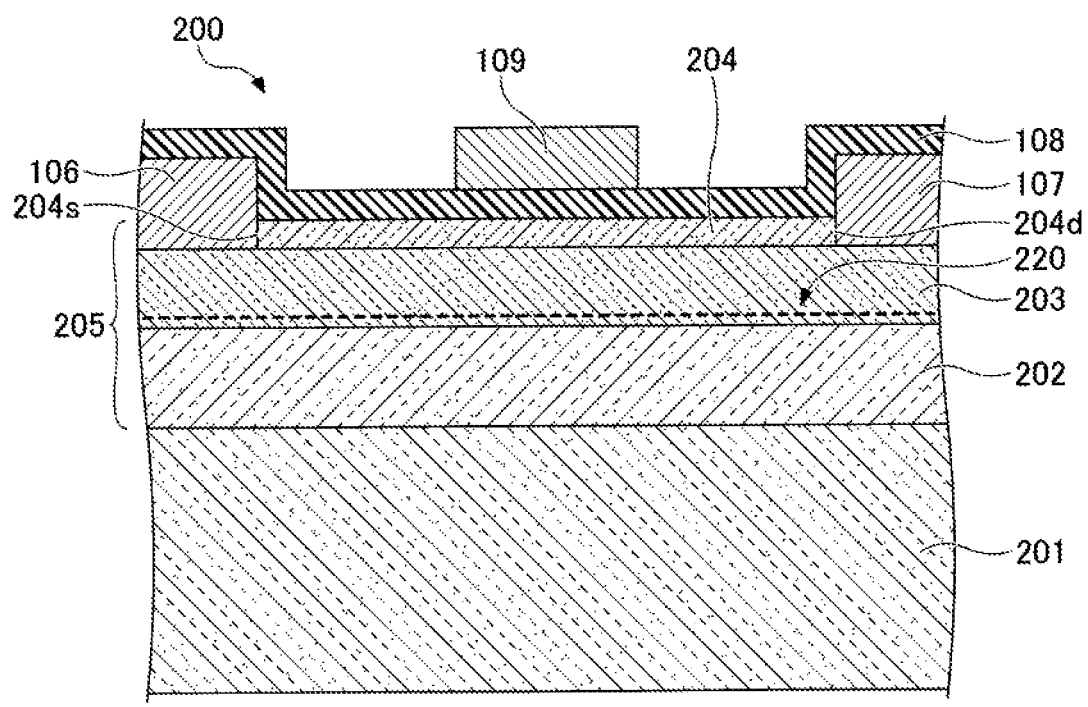
FIG. 13 is a cross-sectional view illustrating a modified example of the second embodiment.
Figure 14:
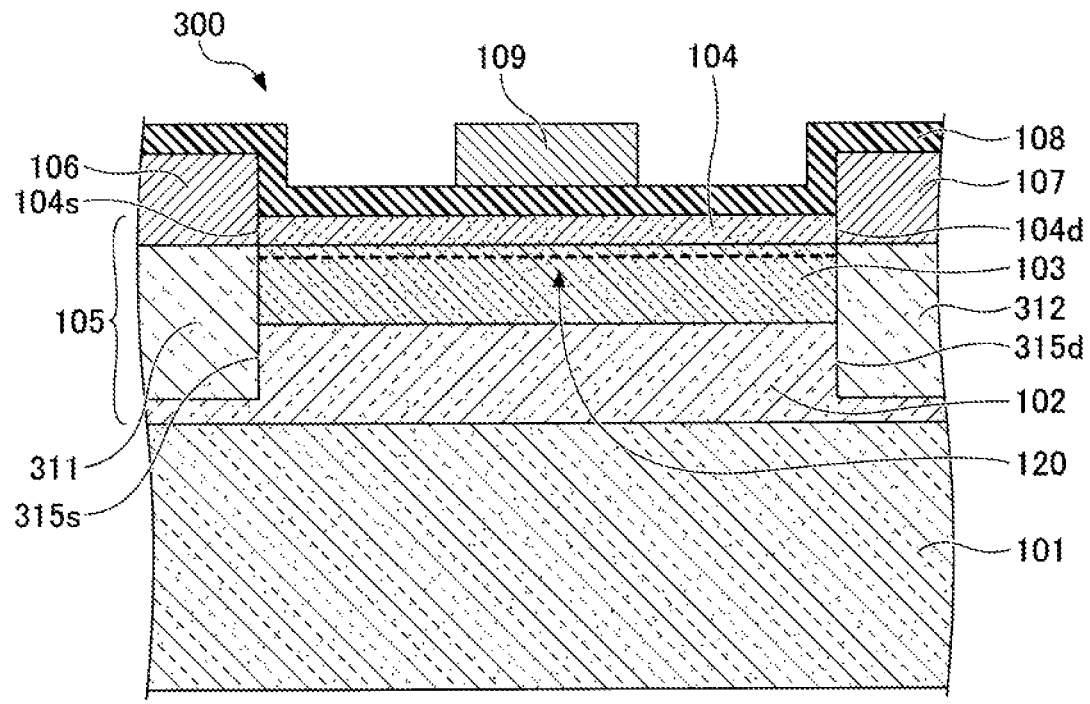
FIG. 14 is a cross-sectional view illustrating a modified example of the third embodiment.
Figure 15:
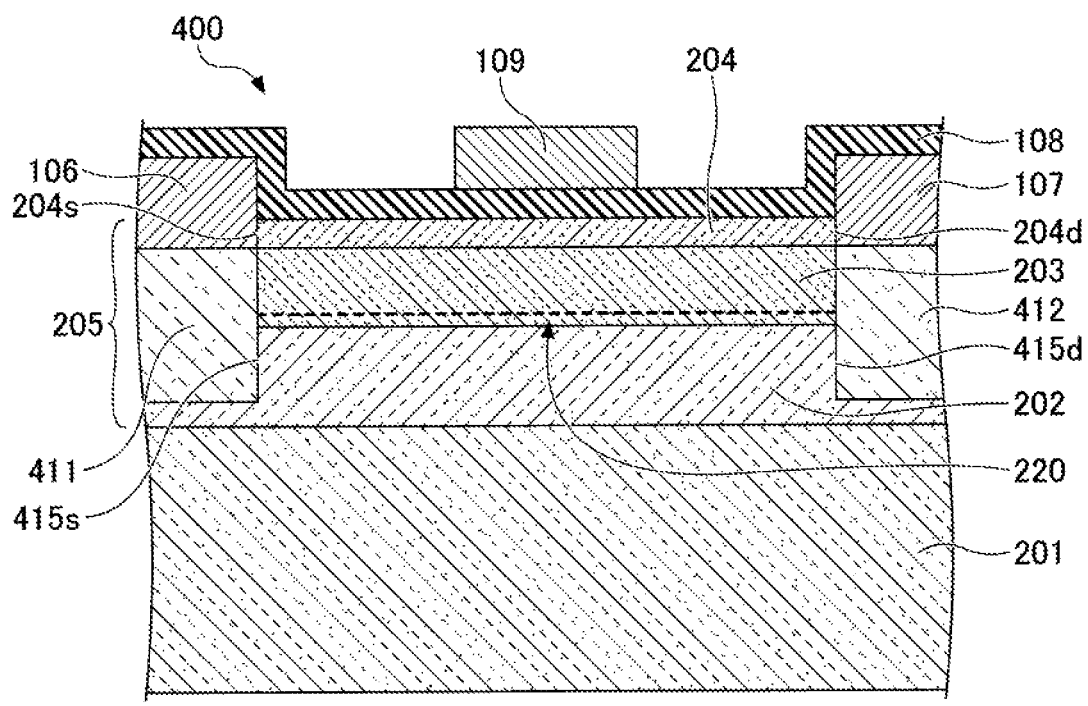
FIG. 15 is a cross-sectional view illustrating a modified example of the fourth embodiment.

Note that although a Schottky type gate structure is adopted in the above first to fourth embodiments, a MIS (metal-insulator-semiconductor) type gate structure may be adopted. FIG. 12 illustrates a modified example of the first embodiment that adopted a MIS type gate structure; FIG. 13 illustrates a modified example of the second embodiment that adopts a MIS type gate structure; FIG. 14 illustrates a modified example of the third embodiment that adopts a MIS type gate structure; and FIG. 15 illustrates a modified example of the fourth embodiment that adopts a MIS type gate structure.

Fifth Embodiment

Figure 16:
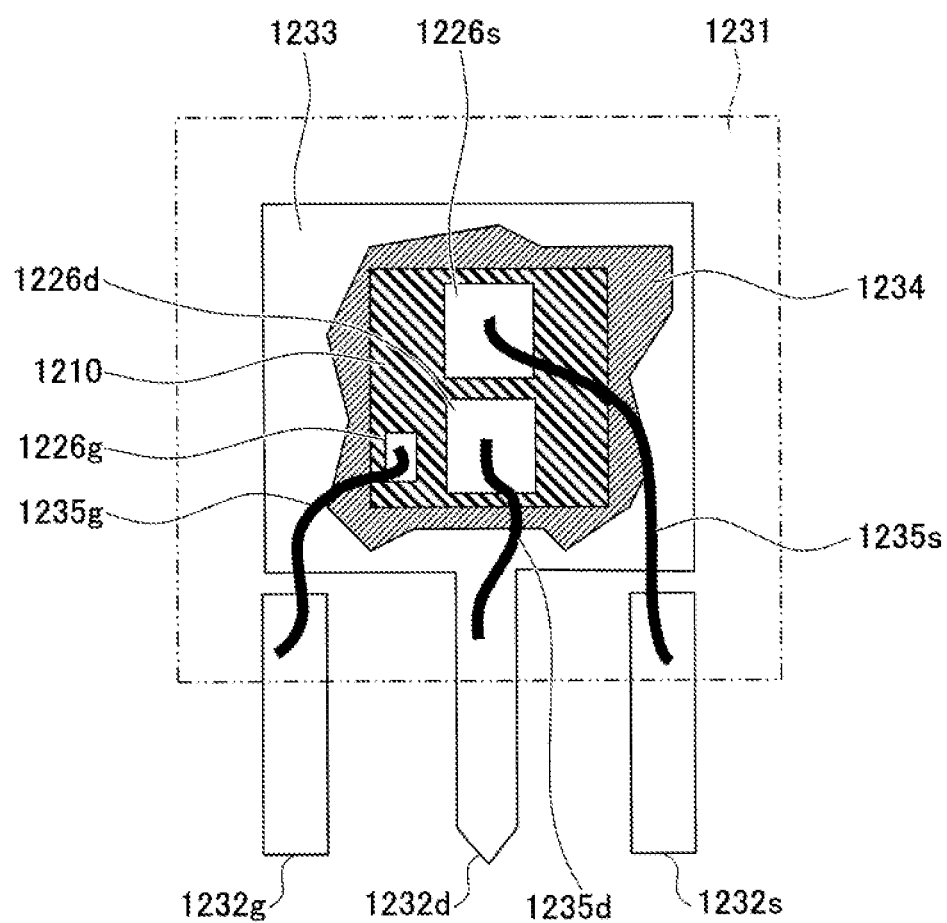
FIG. 16 is a diagram illustrating a discrete package according to a fifth embodiment.

Next, a fifth embodiment will be described. The fifth embodiment relates to a discrete package of a HEMT. FIG. 16 is a diagram illustrating the discrete package according to the fifth embodiment.

In the fifth embodiment, as illustrated in FIG. 16, a back surface of a HEMT chip 1210 of a HEMT according to any one of the first to fourth embodiments is fixed on a land (a die pad) 1233 by using a die attaching agent 1234 such as solder. A wire 1235d such as an Al wire is bonded to a drain pad 1226d that is connected with a drain electrode 107, and the other end of the wire 1235d is bonded to a drain lead 1232d that is integrated with the land 1233. A wire 1235s such as an Al wire is bonded to a source pad 1226s that is connected with a source electrode 106, and the other end of the wire 1235s is bonded to a source lead 1232s that is separated from the land 1233. A wire 1235g such as an Al wire is bonded to a gate pad 1226g that is connected with the gate electrode 109, and the other end of the wire 1235g is bonded to a gate lead 1232g that is separated from the land 1233. The land 1233, the HEMT chip 1210, and the like are packaged in a molding resin 1231 such that a portion of the gate lead 1232g, a portion of the drain lead 1232d, and a portion of the source lead 1232s project outwards from the package.

Such a discrete package may be manufactured, for example, as follows. First, the HEMT chip 1210 is bonded to the land 1233 of a lead frame, by using a die attaching agent 1234 such as solder. Next, by bonding using the wires 1235g, 1235d, and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame. Then, a transfer molding process is executed to seal these elements by using the molding resin 1231. Subsequently, the lead frame is cut off.

Sixth Embodiment

Figure 17:
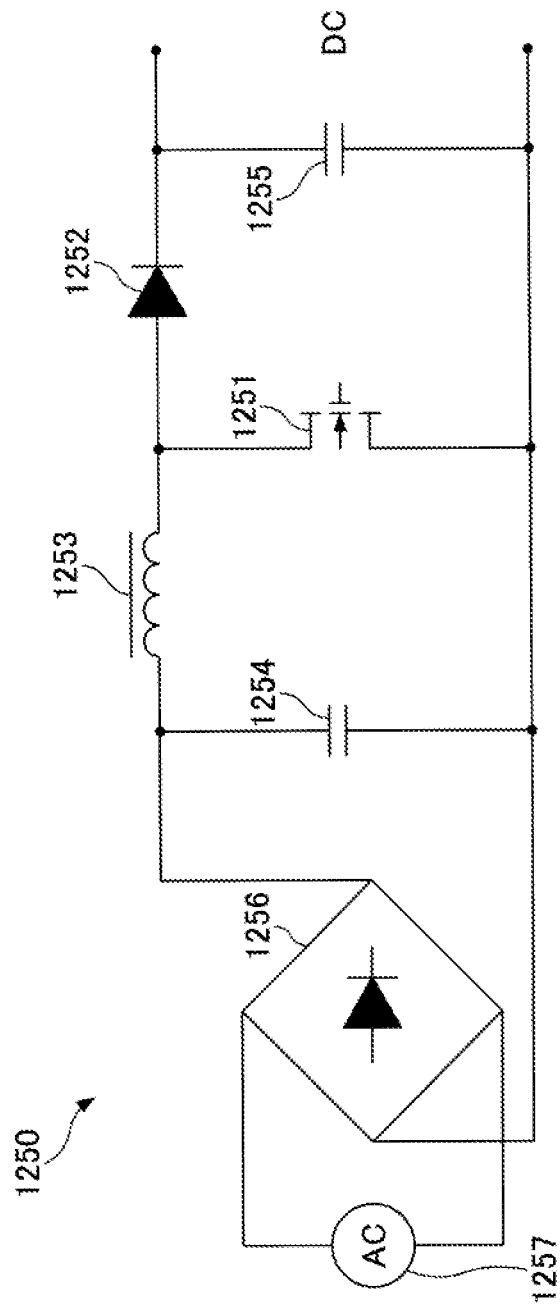
FIG. 17 is a connection diagram illustrating a PFC circuit according to a sixth embodiment.

Next, a sixth embodiment will be described. The sixth embodiment relates to a PFC (power factor correction) circuit that includes a HEMT. FIG. 17 is a connection diagram illustrating the PFC circuit according to the sixth embodiment.

A PFC circuit 1250 has a switching element (a transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. Also, a gate driver is connected to the gate electrode of the switching element 1251. The AC 1257 is connected between both terminals of the capacitor 1254 via the diode bridge 1256. A DC power source (DC) is connected between both terminals of the capacitor 1255. In this embodiment, a HEMT according to any one of the first to fourth embodiments is used as the switching element 1251.

When manufacturing the PFC circuit 1250, the switching element 1251 is connected to the diode 1252, the choke coil 1253, and the like by using, for example, solder.

Seventh Embodiment

Figure 18:
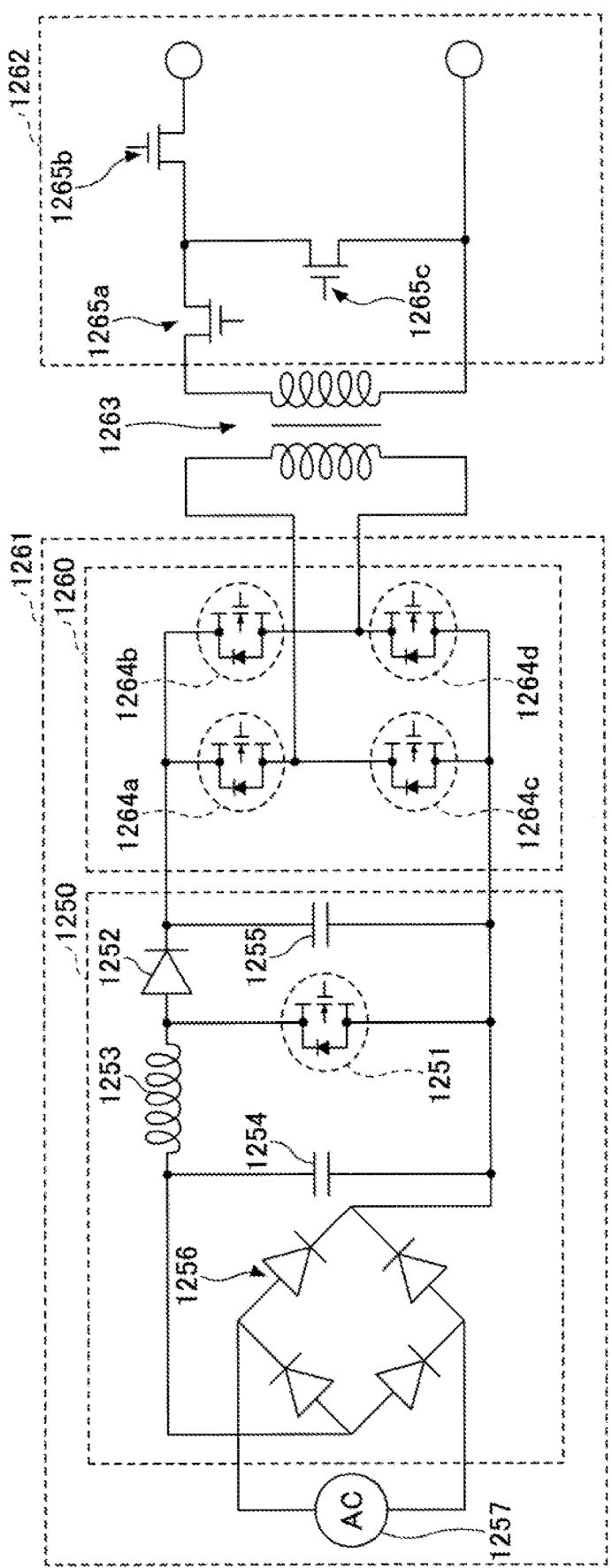
FIG. 18 is a connection diagram illustrating an electric power unit according to a seventh embodiment.

Next, a seventh embodiment will be described. The seventh embodiment relates to a power supply device that includes HEMTs, which is suitable as a power supply of a server. FIG. 18 is a connection diagram illustrating the power supply device according to the seventh embodiment.

The power supply device includes a high-voltage primary-side circuit 1261, a low-voltage secondary-side circuit 1262, and a transformer 1263 disposed between the primary-side circuit 1261 and the secondary-side circuit 1262.

The primary-side circuit 1261 includes a PFC circuit 1250 according to the sixth embodiment, and an inverter circuit that is connected between both terminals of the capacitor 1255 of the PFC circuit 1250, for example, a full-bridge inverter circuit 1260. The full-bridge inverter circuit 1260 includes multiple (here, four) switching elements 1264a, 1264b, 1264c, and 1264d.

The secondary-side circuit 1262 includes multiple (here, three) switching elements 1265a, 1265b, and 1265c.

In this embodiment, in the PFC circuit 1250 and the full-bridge inverter circuit 1260 that constitute the primary-side circuit 1261, HEMTs according to any one of the first to fourth embodiments are used as the switching element 1251 of the PFC circuit 1250, and as the switching elements 1264a, 1264b, 1264c, and 1264d of the full-bridge inverter circuit 1260. On the other hand, ordinary silicon-based MISFETs (metal-insulator-semiconductor field-effect transistors) are used as the switching elements 1265a, 1265b, and 1265c of the secondary-side circuit 1262.

Eighth Embodiment

Figure 19:
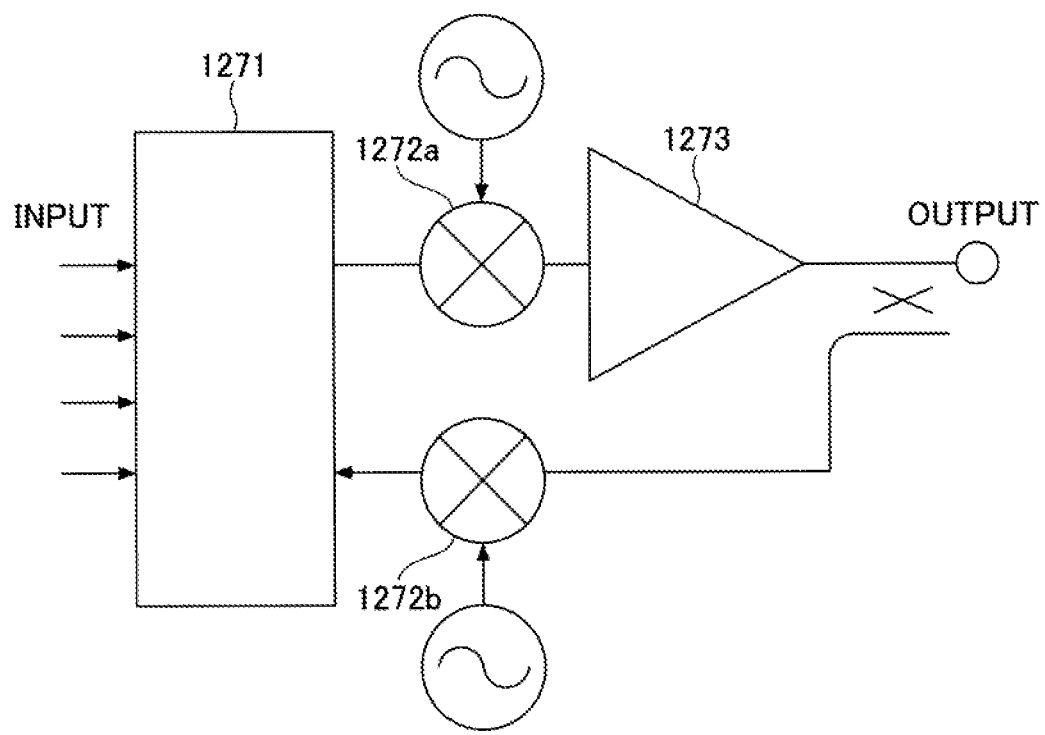
FIG. 19 is a connection diagram illustrating an amplifier according to an eighth embodiment.

Next, an eighth embodiment will be described. The eighth embodiment relates to an amplifier that includes a HEMT. FIG. 19 is a connection diagram illustrating the amplifier according to the eighth embodiment.

The amplifier includes a digital predistortion circuit 1271, mixers 1272a and 1272b, and a power amplifier 1273.

The digital predistortion circuit 1271 compensates input signals for non-linear distortion. The mixer 1272a mixes the input signal having the non-linear distortion compensated, with an AC signal. The power amplifier 1273 includes a HEMT according to any one of the first to fourth embodiments, to amplify the input signal mixed with the AC signal. Note that in this embodiment, for example, by turning on/off a switch, it is possible to mix an output-side signal with an AC signal by using the mixer 1272b, so as to transmit the mixed signal to the digital predistortion circuit 1271. This amplifier may be used as a high-frequency amplifier or a high-output amplifier. A high-frequency amplifier can be used for, for example, transceivers for wireless base stations, radar devices, and microwave generators.

As the substrate, a silicon carbide (SiC) substrate, a sapphire substrate, a silicon substrate, a GaN substrate, or a GaAs substrate may be used. The substrate may be conductive, semi-insulating, or insulating.

The structures of the gate electrode, the source electrode, and the drain electrode are not limited to those described in the above embodiments. For example, these may consist of a single layer. Also, the method of forming these electrodes is not limited to a lift-off method. Furthermore, a heat treatment may be omitted after having formed the source electrode and the drain electrode as long as an ohmic characteristic is obtained. The heat treatment may be executed after having formed the gate electrode.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a first barrier layer containing AlN, over the substrate;
   a channel layer containing BGaN, over the first barrier layer; and
   a second barrier layer containing AlN, over the channel layer,
   wherein a difference between a first lattice constant of the channel layer and a second lattice constant of the first barrier layer is less than or equal to 1.55% of the second lattice constant.

2. The semiconductor device as claimed in claim 1, wherein the first barrier layer is an AlN layer, and
   wherein the channel layer is a BGaN layer whose B composition is greater than or equal to 0.05 and less than or equal to 0.20.

3. The semiconductor device as claimed in claim 1, wherein the substrate is an AlN substrate.

4. The semiconductor device as claimed in claim 1, further comprising:
   a source electrode, a drain electrode, and a gate electrode, over the channel layer.

5. The semiconductor device as claimed in claim 4, further comprising:
   a first contact layer contacting the channel layer and the source electrode; and
   a second contact layer contacting the channel layer and the drain electrode.

6. The semiconductor device as claimed in claim 1, wherein a thickness of the channel layer is less than or equal to 20 nm.

7. The semiconductor device as claimed in claim 1, wherein a surface of the first barrier layer is a (0001) surface.

8. The semiconductor device as claimed in claim 1, wherein a surface of the first barrier layer is a (000-1) surface.

9. An amplifier comprising:
   the semiconductor device as claimed in claim 1.

10. An electric power supply device comprising:
    the semiconductor device as claimed in claim 1.

11. A method of manufacturing a semiconductor device, the method comprising:
    forming a first barrier layer containing AlN, over a substrate;
    forming a channel layer containing BGaN, over the first barrier layer; and
    forming a second barrier layer containing AlN, over the channel layer, wherein a difference between a first lattice constant of the channel layer and a second lattice constant of the first barrier layer is less than or equal to 1.55% of the second lattice constant.

12. The method of manufacturing the semiconductor device as claimed in claim 11, wherein the first barrier layer is an AlN layer, and
wherein the channel layer is a BGaN layer whose B composition is greater than or equal to 0.05 and less than or equal to 0.20.

13. The method of manufacturing the semiconductor device as claimed in claim 11, wherein the substrate is an AlN substrate.

14. The method of manufacturing the semiconductor device as claimed in claim 11, the method further comprising:
forming a source electrode, a drain electrode, and a gate electrode over the channel layer.

15. The method of manufacturing the semiconductor device as claimed in claim 14, the method further comprising:
forming a first contact layer contacting the channel layer and the source electrode, and a second contact layer contacting the channel layer and the drain electrode.

16. The method of manufacturing the semiconductor device as claimed in claim 11, wherein a thickness of the channel layer is less than or equal to 20 nm.

17. The method of manufacturing the semiconductor device as claimed in claim 11, wherein a surface of the first barrier layer is a (0001) surface.

18. The method of manufacturing the semiconductor device as claimed in claim 11, wherein a surface of the first barrier layer is a (000-1) surface.

* * * * *